United States Patent
Gupta et al.

(10) Patent No.: US 11,031,544 B2
(45) Date of Patent: Jun. 8, 2021

(54) MEMORY DEVICE WITH SUPERPARAMAGNETIC LAYER

(71) Applicant: Taiwan Semiconductor Manufacturing Co., Ltd., Hsin-Chu (TW)

(72) Inventors: Gaurav Gupta, Hsinchu (TW); William J. Gallagher, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 36 days.

(21) Appl. No.: 16/506,083

(22) Filed: Jul. 9, 2019

(65) Prior Publication Data

US 2020/0106001 A1 Apr. 2, 2020

Related U.S. Application Data

(60) Provisional application No. 62/737,213, filed on Sep. 27, 2018.

(51) Int. Cl.
| | |
|---|---|
| *H01L 43/02* | (2006.01) |
| *H01L 43/10* | (2006.01) |
| *H01L 43/12* | (2006.01) |
| *H01L 27/22* | (2006.01) |

(52) U.S. Cl.
CPC ............ *H01L 43/02* (2013.01); *H01L 27/228* (2013.01); *H01L 43/10* (2013.01); *H01L 43/12* (2013.01)

(58) Field of Classification Search
CPC ........ H01L 43/02; H01L 27/228; H01L 43/10

USPC ........................................................ 257/427
See application file for complete search history.

(56) References Cited

U.S. PATENT DOCUMENTS

| | | | |
|---|---|---|---|
| 8,941,196 B2 | 1/2015 | Bedau et al. | |
| 9,853,206 B2 | 12/2017 | Pinarbasi et al. | |
| 2018/0047894 A1 | 2/2018 | Pinarbasi et al. | |
| 2020/0006628 A1* | 1/2020 | O'Brien | H01F 41/302 |

OTHER PUBLICATIONS

Timopheev et al. "Second Order Anisotrophy Contribution in Perpendicular Magnetic Tunnel Junctions." Scientific Reports, published on Jun. 1, 2016.

Dieny et al. "Introduction to Magnetic Random-Access Memory" Chapter 5: Magnetic Random Access Memory. ISBN: 978-1119009740, published on Dec. 12, 2016.

Fong et al. "Spin-Transfer Torque Memories: Devices, Circuits, and Systems." Proceedings of the IEEE, vol. 104, No. 7, Jul. 2016.

Roman, Silvia. Supermagnetic Nanoparticles and the Separation Problem. Published on Mar. 5, 2014.

Ikeda et al. "A Perpendicular-Anisotrophy CoFeB—MgO Magnetic Tunnel Junction." Nature Materials, vol. 9, published on Jul. 11, 2010.

(Continued)

*Primary Examiner* — Elias Ullah
(74) *Attorney, Agent, or Firm* — Eschweiler & Potashnik, LLC

(57) ABSTRACT

In some embodiments, the present application provides a memory device. The memory device includes a ferromagnetic free layer; a non-magnetic barrier layer overlying the ferromagnetic free layer; and a superparamagnetic free layer overlying the non-magnetic barrier layer.

20 Claims, 15 Drawing Sheets

(56) References Cited

OTHER PUBLICATIONS

Zhu et al. "Magnetic Tunnel Junctions." Materials Today, vol. 9, No. 11, Nov. 2006.

Sbiaa et al. "Spin Transfer Switching Enhancement in Perpendicular Anisotropy Magnetic Tunnel Junctions With a Canted In-Plane Spin Polarizer." J. Appl. Phys. 105, 013910 (2009), published on Jan. 6, 2009.

Lacoste et al. "Control of Sub-Nanosecond Precessional Magnetic Switching in STT-MRAM Cells for SRAM Applications." 2016 IEEE 8th International Memory Workshop (IMW), published on Jun. 23, 2016.

Park et al. "Fast Deterministic Switching in Orthogonal Spin Torque Devices via the Control of the Relative Spin Polarizations." Appl. Phys. Lett. 103, 252406 (2013), published on Dec. 18, 2013.

Lacoste et al. "Modulating Spin Transfer Torque Switching Dynamics With Two Orthogonal Spin-Polarizers by Varying the Cell Aspect Ratio." Physical Review B 90, 224404 (2014), published Dec. 2014.

Bedau et al. "Orthogonal Spin Transfer MRAM." IEEE 69th Device Research Conference, published Sep. 12, 2011.

Liu et al. "Precessional Reversal in Orthogonal Spin Transfer Magnetic Random Access Memory Devices." Appl. Phys. Lett. 101, 032403 (2012), published Jul. 18, 2012.

Nikonov et al. "Strategies and Tolerances of Spin Transfer Torque Switching." J. Appl. Phys. 107, 113910 (2010), published Jun. 3, 2010.

Rowlands et al. "Coherent Spin-Transfer Precession Switching in Orthogonal Spin-Torque Devices." APS March Meeting 2016, published Nov. 2016.

\* cited by examiner

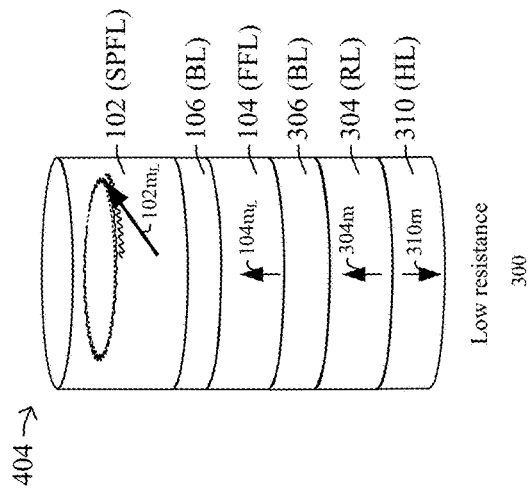
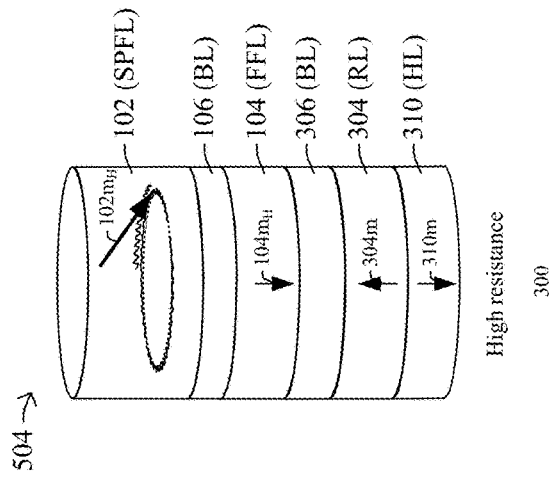
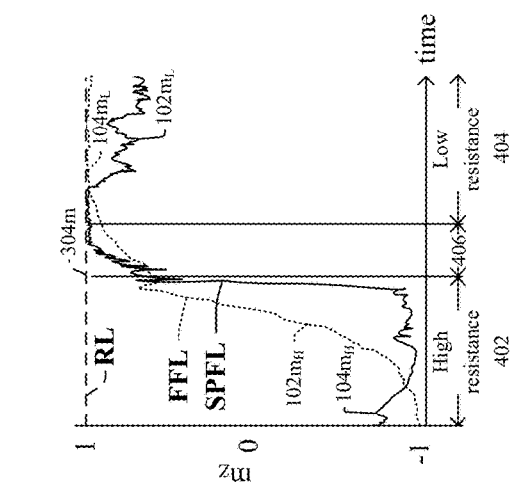
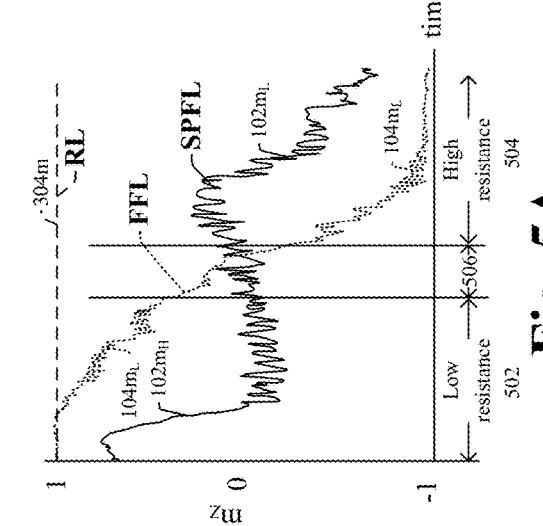
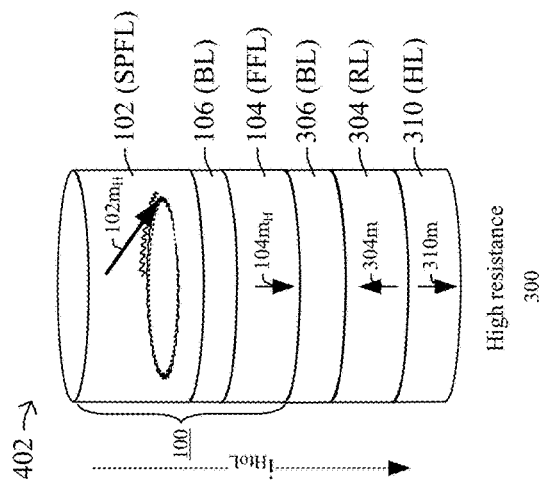
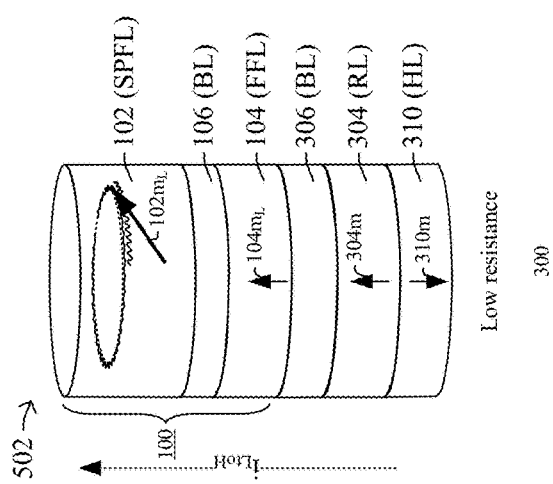
Fig. 4A
Fig. 5A

MEMORY DEVICE WITH SUPERPARAMAGNETIC LAYER

REFERENCE TO RELATED APPLICATION

This Application claims the benefit of U.S. Provisional Application No. 62/737,213, filed on Sep. 27, 2018, the contents of which are hereby incorporated by reference in their entirety.

BACKGROUND

This disclosure relates in general to volatile and nonvolatile memory for use in stand-alone memory chips and for memory arrays integrated on to logic chips. More particularly, this disclosure relates to magnetic memory devices for integrated circuits that store information according to the direction of magnetic moments in magnetic film layers within magnetic tunnel junction (MTJ) devices. Such memory is most commonly referred to as magnetoresistive random access memory or MRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A illustrates how the magnetizations of some of the magnetic layers within a magnetic tunnel junction stack can transition when the cell is written from a high resistance state to a low resistance state in accordance with some embodiments.

FIG. 5A illustrates some embodiments for how the magnetization directions of layers within a magnetic tunnel junction stack can transition when the cell is written from a low resistance state to a high resistance state in accordance with some embodiments.

DETAILED DESCRIPTION

Figure 1A:
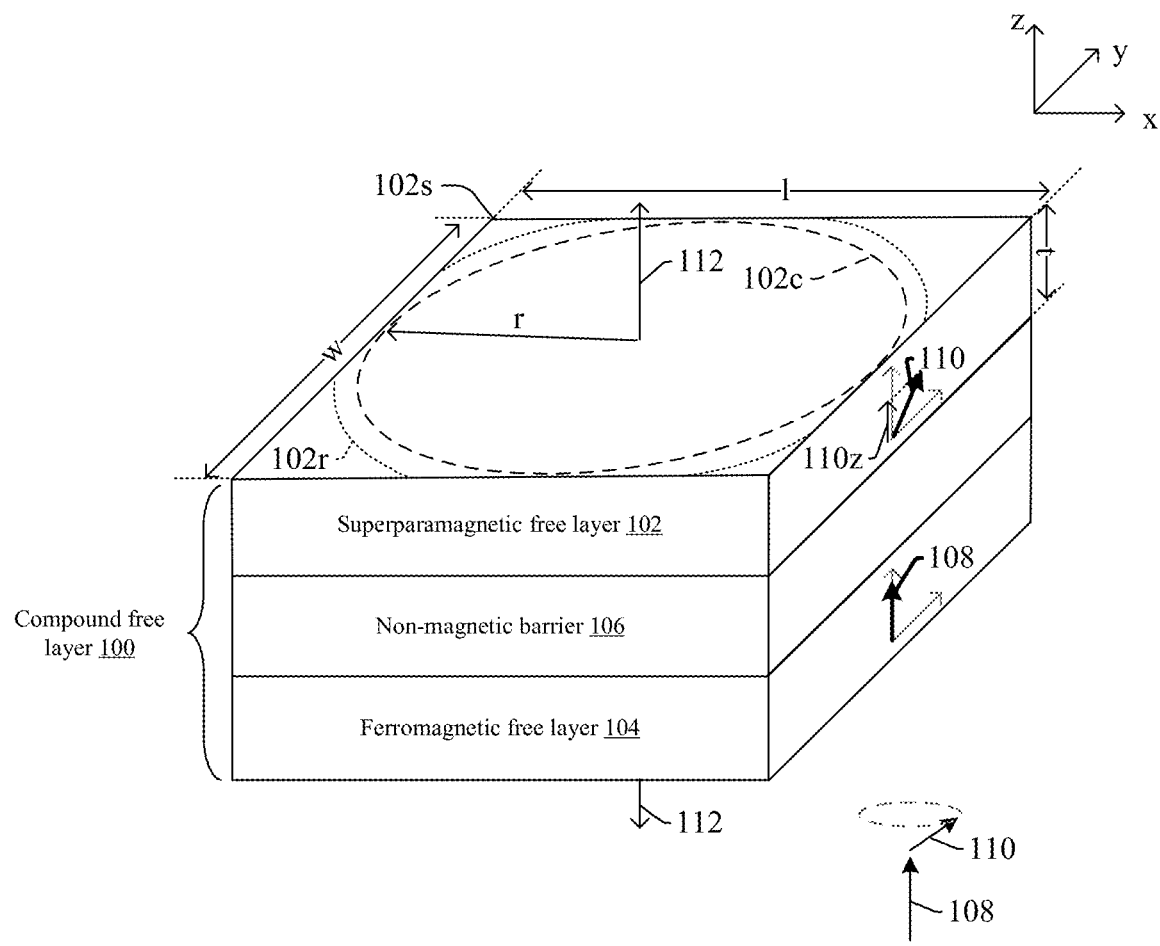
FIG. 1A illustrates a three dimensional view of some embodiments of a compound free layer structure in one memory state. The compound free layer structure includes a ferromagnetic free layer and a superparamagnetic free layer, and it is suitable for a magnetic tunnel junction.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) includes first and second ferromagnetic films separated by a thin non-magnetic barrier layer, typically a quantum mechanical tunnel barrier layer. One of the ferromagnetic films (often referred to as a "reference layer") has a fixed magnetization direction, while the other ferromagnetic film (often referred to as a "free layer") has a variable magnetization direction. If the magnetization directions of the reference layer and free layer are in a parallel (P) orientation, electrons will relatively more easily tunnel through the tunnel barrier layer, meaning that the MTJ is in a low-resistance state. Conversely, if the magnetization directions of the reference layer and free layer are in an antiparallel (AP) orientation, electrons will have more difficulty tunneling through the tunnel barrier layer, meaning that the MTJ is in a high-resistance state. The MTJ can be switched between two states of electrical resistance by reversing the magnetization direction of the free layer.

There are a number of mechanisms by which the state of the free layer can be switched, including by Oersted fields from x- and y-address wires in a memory array, as in so called "field MRAM," and by spin-transfer torque (STT) from electrons tunnelling through the tunnel barrier, as in so called "STT MRAM." The free and reference magnetic layers within a MTJ have anisotropy axes with two opposite directions in which the magnetization can preferably point. These anisotropy axes can be along some direction in the plane of the magnetic film layer or they can be along the directions perpendicular to the layer surfaces. Generally, to achieve in-plane anisotropy, designers use shapes with substantial in-plane anisotropies, e.g., elongated elliptically shaped slabs, not cylindrical shapes or square shaped slabs. On the other hand, perpendicular anisotropies can be induced in very thin films with interface or intrinsic anisotropy-inducing effects that overcome shape anisotropy. Thus magnetic layers with perpendicular magnetic anisotropy can have two stable perpendicular magnetization states and can occupy less area than magnetic layers with in-plane anisotropy. Magnetic layers with perpendicular anisotropy can be written using less electrical current than magnetic layers with in-plane anisotropy, for cases when the respective magnetic free layers have similar magnetic stability, i.e., similar data retention.

Among various approaches to MRAM, under most serious development today are MTJs with anisotropy axes perpendicular to the layer planes with writing done by switching the magnetic states utilizing torques from spins injected into the magnetic free layers. Consider an x-y-z coordinate system where the reference layer, tunnel barrier layer, and free layer each extend laterally in the x- and y-directions (x-y plane); and the reference layer, tunnel barrier layer, and free layer are stacked over one another along the z-axis. In an example using perpendicular magnetic anisotropy layers, the magnetization directions for the free layer and reference layer would point along the positive or negative z-axis within the respective layers. The magnetizations directions are parallel (e.g., both upwards or both downwards along the z-axis) or anti-parallel (e.g., one upwards and the other downwards along the z-axis) depending on the state stored, and thus still give rise to a low resistance or high resistance state for the MTJ. For this type of MTJ, the energy-barrier is same or nearly same for both retention and write operations. (This is not the case for in-plane anisotropy free layers, where the barrier to be overcome for writing is substantially greater than the barrier for retention). An additional advantage of perpendicular magnetization layers is that shape anisotropy in the x-y plane offers no advantage, the MTJ can be symmetric (e.g., round or square with rounded corners) in the x-y plane, which potentially provides the perpendicular MTJs with higher packaging densities than in-plane MTJs. Despite improvement over the in-plane MTJs, the device efficiency, generally defined as the ratio of stability energy to write current, still remains a serious challenge especially for ultra-fast write operations (switching by utilizing torque generated from injected spins to generate a growing in-plane precessional motion of the free layer magnetization until it switches perpendicular direction). The current approach for switching involves a write current magnitude that scales-up directly with the energy-barrier for retention and exponentially with the smaller write-time. These large currents and voltages not only imply substantial energy-dissipation, but also can lead to reliability issues due to breakdown of the tunnel barrier within the MTJ.

Figure 10:
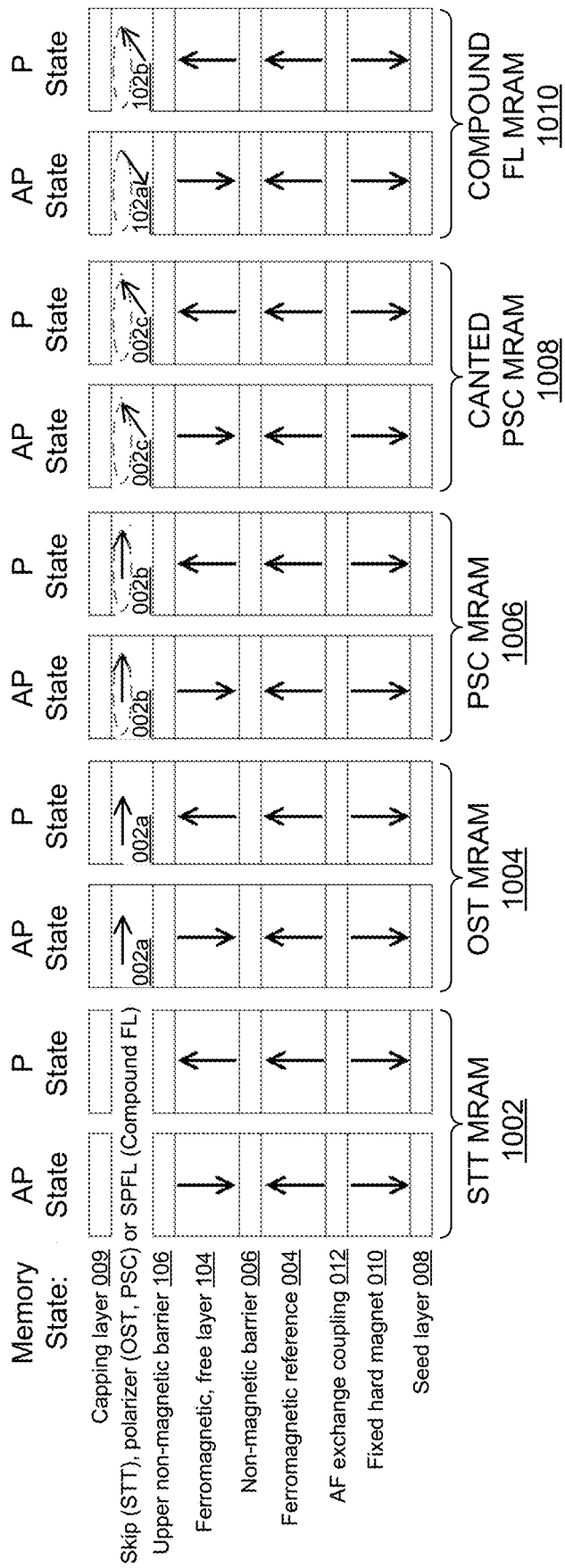
FIG. 10 illustrates a chart depicting several different MRAM stacks, and the magnetization directions of the various layers for an anti-parallel (AP) state and parallel (P) state for each of the MRAM stacks.

In a STT MRAM device, there are two stable states, one higher resistance (AP) state and one lower resistance (P) state. The first two device columns in FIG. 10 illustrate several layers of an exemplary MTJ structure for STT MRAM 1002. The STT MRAM includes three magnetic layers, the ferromagnetic reference layer 004 and the ferromagnetic free layer 104, which we have already mentioned, and also a fixed hard magnet layer 010. Their magnetization configurations for AP and P states respectively are also illustrated in the first and second device columns, respectively. The fixed hard magnet layer 010 is coupled in an antiferromagnetic manner through an antiferromagnetic exchange coupling layer 012 to the ferromagnetic reference layer 004. The fixed hard magnet layer 010 and the ferromagnetic reference layer 004 perform several functions. Firstly, the combination makes the magnetization of the ferromagnetic reference layer 004 hard to disturb or reverse, such that the magnetizations of these layers remain substantially perpendicular during device operations and remain pointing in their same respective directions for both the AP state and the P state. Secondly, the magnetic moments of the fixed hard magnet layer 010 and ferromagnetic reference layer 004 largely cancel each other such that their net stray field in the vicinity of the ferromagnetic free layer 104 is (by design) very small. This in turn helps the ferromagnetic free layer 104 have a very small response to external magnetic fields with magnitudes centered around zero external magnetic field. Thirdly, the fixed hard magnet layer 010, having the highest magnetic coercivity of all the magnetic layers in the stack, provides a mechanism to initialize the device during or just after fabrication. A large "setting" magnetic field pointing downward will initialize the fixed hard magnet layer 010 into the down state, then as the setting field is lowered, the antiferromagnetic exchange coupling causes the ferromagnetic reference layer 004 to point in a direction opposite to the fixed hard layer (e.g., up in FIG. 10). Thus the ferromagnetic reference layer 004 can be initialized in the desired direction, and the stray fields from the ferromagnetic reference layer 004 and fixed hard magnet layer 010 can be largely cancelled in the vicinity of the ferromagnetic free layer 104.

State switching (AP to P or P to AP) in the STT MRAM device 1002 is accomplished by applying a current pulse to flow through the STT MRAM stack. For electrons (with their associated spins) flowing up for example through the ferromagnetic reference layer 004, then through the non-magnetic barrier layer 006 (typically a tunnel barrier), then through the ferromagnetic free layer 104, the magnetization direction of the ferromagnetic free layer 104 will be switched from pointing down to pointing up. The driving force for the switching is torques from the spins of the injected electrons acting on the magnetization of the free layer. There is a variable component of the switching delay due to the need for an initial deviation from strictly perpendicular magnetization layers. There is no torque if the net injected spin magnetic moment direction and the magnetization direction of the ferromagnetic free layer 104 are exactly parallel (and vanishingly small torque as these directions approach being parallel). Switching is nucleated once there is a thermal fluctuation sufficient to start the spin torque effects that is strong enough to overcome the intrinsic damping in the ferromagnetic free layer 104. The long and variable incubation time for starting the switching operation is a limiting aspect for high speed write operations of MTJs.

Another type of MTJ for MRAM usage is a so-called Orthogonal Spin Torque (OST) MTJ 1004, such as shown in columns three and four of FIG. 10. OST MTJs involve an added magnetic layer—so called OST polarizer layer 002a in FIG. 10—to serve the function of applying a perpendicular moment component to the injected spin current in order to quickly initiate the torque that leads to free layer switching. OST-MTJs can utilize either in-plane or perpendicular magnetic anisotropy for their ferromagnetic free layers (FFLs) 104. We concern ourselves with OST devices that have perpendicular magnetic anisotropy in their FFLs 104. The third and fourth device columns in FIG. 10 illustrate exemplary magnetic layer arrangement for OST MRAM devices 1004 in which both the ferromagnetic free layer 104 and the ferromagnetic reference layer 004 have perpendicular magnetizations. The hard magnet layer 010 and the ferromagnetic reference layer 004 have their magnetic anisotropy directions and magnetization vectors point in the perpendicular direction (z-axis) oppositely, in the same manner these layers are configured in STT-MRAM device 1002. The OST polarizer layer 002a is introduced on the other side (i.e., the top side) of the ferromagnetic free layer 104, separated from the ferromagnetic free layer 104 by an upper non-magnetic barrier 106. The magnetization direction of the OST polarizer layer 002a is in-plane (xy plane), pointing in a particular direction within the xy plane and anchored in that direction by in-plane magnetic anisotropy, usually due to shape anisotropy. The OST polarizer layer 002a is separated from the FFL 104 by an upper non-magnetic barrier layer 106, which can be a non-magnetic metal or a tunnel barrier. (Whichever is used is designed to have lower specific resistance than the non-magnetic barrier layer 006, so that the upper non-magnetic barrier layer 106 does not dominate the specific resistances of the two storage states, which rather are dominated by the non-magnetic barrier layer 006, generally a tunnel barrier). The upper non-magnetic barrier layer 106 also allows the spin of the electrons to be transported across the barrier, which means that the OST polarizer layer 002a leads to torques being immediately induced by its injected tunnelling electrons, since their spin directions are perpendicular and not in parallel with those transmitted or reflected from the non-magnetic barrier layer 006. Thus as soon as current starts flowing, the OST MRAM 1004 has non perpendicular spin injection which helps to quickly incubate the switching of the FFL 104 by providing initial non-zero torque. This substantially improves the write-speed.

In-plane shape anisotropy is used to stabilize the direction of magnetization in the OST polarizer layer 002a. This in-plane shape anisotropy decreases the packing density of OST MRAM devices 1004 compared to STT MRAM devices 1002. Furthermore, the orthogonal dipolar field from OST polarizer layer 002a to FFL 104 simultaneously has the following three deleterious effects on the MTJ. First, it lowers the energy-barrier for the retention and hence the data information can be more easily lost, resulting in larger Retention Error Rate (RER). Second, during read-operations current is passed through the MTJ to detect its state, and due to weaker stability of the MTJ, its present state is more easily over-written, resulting in a larger Read Disturb Rate (RDR). Third, since the dipolar field of FFL 104 is not well aligned with the ferromagnetic reference layer 004, irrespective of parallel or anti-parallel state, the magnetic tunnel junction's normalized change of resistance upon storage state reversal (its tunnelling magnetoresistance—TMR), is impaired.

Still there is another extension of the OST-MTJ called the Precessional Spin Current (PSC) MTJ 1006, such as shown in columns five and six of FIG. 10. In the PSC MTJ 1006, the OST polarizer layer is made substantially circular in the x-y plane, and the magnetization of the OST polarizer layer, now called a PSC layer 002b, can freely rotate around the perpendicular (z-) axis of the MTJ structure. The magnetic layers of the PSC MTJ device 1006 are shown in the fifth and sixth columns of FIG. 10 for the AP and P states, respectively. In the illustration, a dashed circle is associated within the PSC layer 002b to indicate that that layer's magnetization can freely rotate within the x-y plane direction. Furthermore, the magnetization direction of the PSC layer 002b in a PSC-MTJ follows the precession of the magnetization direction of the FFL 104, the switching operation relying on synchronization of the precession of the PSC layer 002b with the precession of the FFL 104, wherein precession of the PSC layer 002b has a non-zero rotation frequency. In this type of MTJ, due to non-zero angle between the magnetization of the PSC layer 002b and the FFL 104, torque on the FFL 104 is immediately initiated when current starts to flow. Thus incubation is immediate and switching can be faster and its timing more predictable. Since the PSC layer 002b is switched more quickly and predictably, the amount of current needed for reliable writing can be reduced. While the area of the PSC MRAM 1006 can be reduced since shape anisotropy is not needed in any layer, the PSC MRAM 1006 still suffers from some of the same issues that affected the OST device 1004 performance The moment from the PSC layer 002b will to some extent cant the magnetization of the FFL 104 and make its storage weaker, i.e. give it a larger retention error rate. For a similar reason, there will be a larger probability of unintentionally writing a bit during a read operation compared to that of a cell without the PSC layer 002b, i.e., increasing the read disturb rate (RDR), which is undesirable. Also, in a similar manner to the OST device 1004, the moment of the PSC layer 002b will impact the degrees of parallel or antiparallel alignment of the FFL 104 with the ferromagnetic reference layer 004 and thereby lower the tunnelling magnetoresistance.

Still there is another variation of the PSC MRAM 1008 that employs a canted OST polarizing layer 002c. This is illustrated by the seventh and eighth columns in FIG. 10, where a canted OST polarizing layer 002c is shown as being canted vertically out of the x-y plane. This canted PSC MRAM 1008 also has no (or weak) shape anisotropy and thus the canted OST polarizing layer 002c is free to have its x-y component rotate in the plane. The canting angle is allowed to vary from 0 to 90 degrees from the perpendicular axis. Note that for the P state, the canted OST polarizing layer 002c will guide and reinforce the magnetic flux lines that emerge from the FFL 104. For the AP state, however, the magnetic flux lines emerging from the canted OST polarizing layer 002c and the FFL 104 will oppose each other. Thus, in the P state storage stability/data retention will be somewhat improved relative to the STT or OST or uncanted PSC devices, but in the AP state the storage stability/data retention will be weakened. Depending on device and circuit design, RDR could be weakened or strengthened, but TMR will still be degraded compared to the STT MRAM case.

Thus there is a need for a spin torque transfer device that supports fast switching with less compromising of storage stability, read disturb rate, and TMR.

The last two columns of FIG. 10 thus illustrate a compound free layer MRAM 1010 that provides for substantially improved ferromagnetic memory cells that make use of a special type of superparamagnetic free layer 102a, 102b. This superparamagnetic free layer 102a, 102b (if made in isolation from other magnetic layers) has a magnetization direction that is neither in-plane nor perpendicular. Rather, the superparamagnetic free layer 102a, 102b has a magnetization direction that varies randomly in time, but the time-varying magnetization direction varies continuously between in-plane and partially perpendicular. The superparamagnetic free layer 102a, 102b is symmetric enough in the x-y plane such that even at the lowest desired operation temperature the superparamagnetism can overcome any weak shape anisotropy due to asymmetries in the MTJ device layer shapes about a perpendicular axis, which may occur due to normal MTJ fabrication limitations or imperfections. The random variation of the magnetization direction occurs predominantly in the x-y plane, but also to an extent in the perpendicular direction. The extent of variation from the plane could range up or down to angles of +/−20 to +/−30 degrees or more from the x-y plane with some probability at some temperatures.

The present disclosure provides an MTJ stack intended for MRAM applications in which a superparamagnetic free layer 102a, 102b is placed at a location above the FFL 104 (i.e., opposite from the ferromagnetic reference layer 004) and is separated from FFL 104 by a non-magnetic barrier layer 106, which may be a tunnel barrier or a non-magnetic metal. In this position, the superparamagnetic free layer 102a, 102b is magnetostatically coupled to the FFL 104 and thus influenced by the magnetic flux emerging from the FFL 104. In fact, the superparamagnetic free layer 102a, 102b acquires a net fluctuating perpendicular component of magnetization in the same perpendicular direction as the magnetic flux lines emerging from the FFL 104. The average angle of the superparamagnetic free layer's magnetization above or below the plane may range from roughly 20 to 55 degrees, for example. In the storage state, the superparamagnetic free layer 102a, 102b is thus coupled to the FFL 104 as a type of "compound" free layer representing the combination of the FFL 104 and the superparamagnetic free layer 102a, 102b.

There are a number of advantages this compound free layer brings to an MRAM stack. The magnetic coupling between the superparamagnetic layer and the FFL 104 provides a stabilizing feedback field which improves the stability of the free layer and thus enables a more stable memory state (lower retention error rate). On the other hand, the electrical interaction between the superparamagnetic layer and the FFL 104 furnishes the free layer with non-zero torque during incubation which results in faster writes at lower write-error rates and using less current than previous approaches. Since both retention is improved and write current is reduced, device efficiency (retention barrier divided by write current) is substantially improved. Furthermore, since the read-operation is done in a regime where thermal fluctuations could lead to spurious switching, the additional retention stability offered due to magnetic interaction helps to lower the read-disturb rate as well. Hence, this superparamagnetic layer improves both write nucleation and storage layer (free layer) storage stability, thereby disentangling the read, write and retention constraints simultaneously and improving all three error rates.

FIG. 1A shows a compound free layer 100 in accordance with some embodiments. The compound free layer 100 includes a superparamagnetic free layer 102, a ferromagnetic free layer 104, and a non-magnetic barrier layer 106 separating the superparamagnetic free layer 102 from the ferromagnetic free layer 104.

Figure 1B:
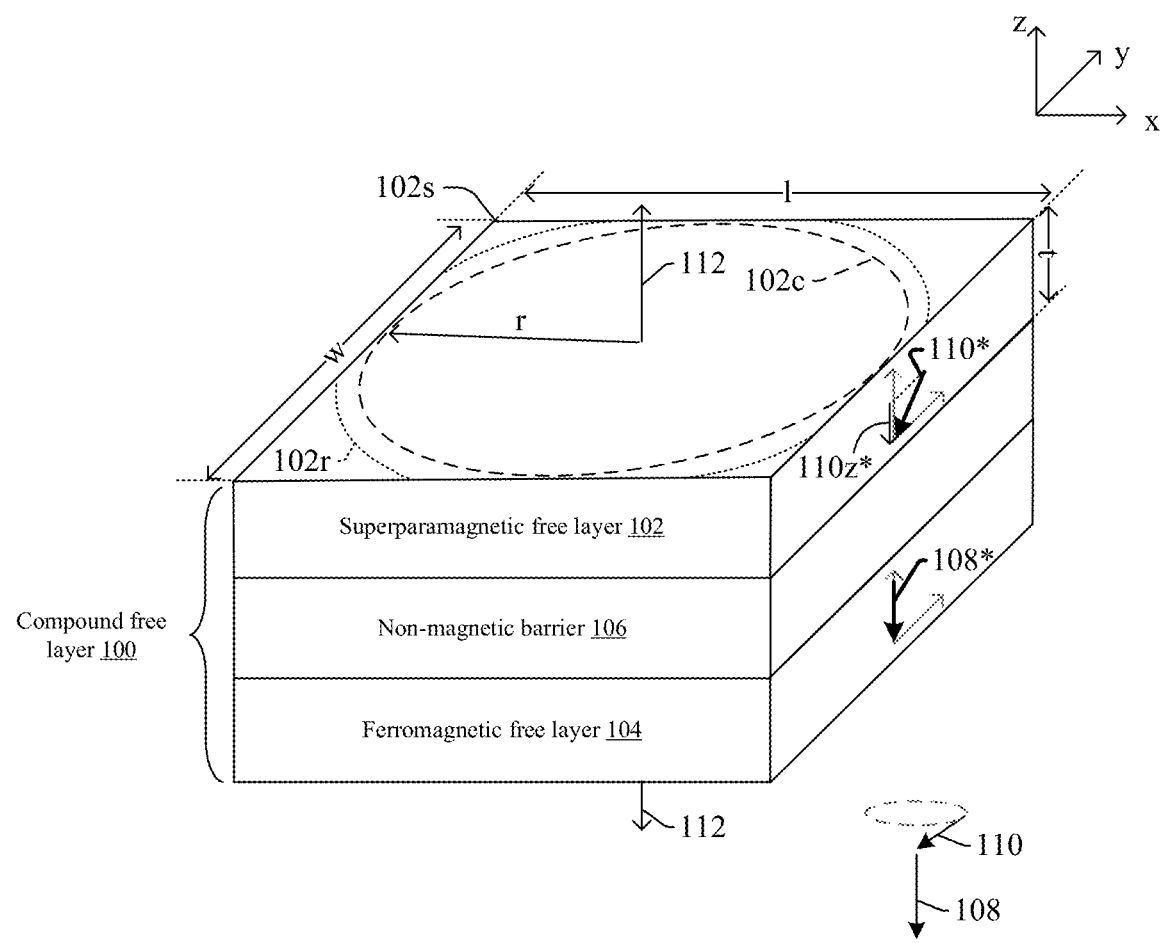
FIG. 1B illustrates a three dimensional view of a compound free layer in a second memory state, with the ferromagnetic free layer and the superparamagnetic layer having their z-direction components of magnetization reversed.

The ferromagnetic free layer 104 is capable of having its stable magnetization direction 108 changed between one of two magnetization states, which are then correlated to binary data states. For example, in a first state, the ferromagnetic free layer 104 can have a first magnetization direction (e.g., pointing upwards as illustrated by 108) aligned in parallel with that of a reference layer (see e.g., P state of 1010 in FIG. 10), which provides a first resistance. In a second data state, illustrated in FIG. 1B, the ferromagnetic free layer 104 can have a second magnetization direction (e.g., pointing downward as illustrated by 108*) aligned anti-parallel with that of the reference layer (see e.g., AP state of 1010 in FIG. 10), which provides a second resistance, which differs from the first resistance and can, for example, be greater than the first resistance. Note that as illustrated in FIGS. 1A and 1B, the superparamagnetic free layer moment has a z-component that changes direction when the data state is changed and thus in both states the z-component $110z$ or $110z^*$ points in the same general direction as the ferromagnetic free layer's moment (FIG. 1A: 108, or FIG. 1B: 108*). The reversal of the z-moment of the superparamagnetic free layer is beneficial for providing added stability for the free layer storage state, as will be described later.

Ferromagnetic free layer 104 can either be one ferromagnetic metal or an alloy or a multilayer or graded composition of ferromagnetic metals. It may furthermore have a thin buffer non-magnetic transition metal layer of (e.g., Ta, Hf, W, Mo, V, Mg, etc. of thickness from 0.1 nm to 1 nm) or their alloys physically breaking the ferromagnetic free layer (FFL) into two ferromagnetic units $FFL_1$ and $FFL_2$ which may or may not have the same ferromagnetic composition and thickness. This transition metal can serve as a spacer layer to lower the magnetization of the free layer. It can alternatively or in combination serve to absorb boron diffusing from other layers within the stack during high temperature device fabrication processing steps.

In some embodiments, the ferromagnetic free layer 104 can be comprised of a magnetic metal, such as cobalt, iron, nickel, and alloys thereof, for example. Also for instance, in some embodiments, the ferromagnetic free layer 104 can be comprised of cobalt, iron, and boron, such as a CoFeB ferromagnetic free layer; and the non-magnetic barrier layer 106 can be comprised of an amorphous barrier, such as aluminum oxide ($AlO_x$) or titanium oxide ($TiO_x$), or a crystalline barrier, such as magnesium oxide (MgO) or spinel (e.g., $MgAl_2O_4$). In still other embodiments the non-magnetic barrier layer 106 could be a thin non-magnetic metal, such as Ta, TaN, W, WN, Mo, MoN, Hf or HfN.

In the superparamagnetic free layer 102, the magnetization direction 110 is unstable and can randomly change direction due to random thermal fluctuations. Due to magnetic interaction with the free-layer, despite the randomness, the magnetization direction 110 picks up a preferred magnetization direction component (FIG. 1A: $110z$, or FIG. 1B, $110z^*$) in parallel with the magnetization direction 108 or 108* of the ferromagnetic free layer 104, while the x- and y-components of the magnetization of the superparamagnetic free layer vary randomly. For example, in FIG. 1A, the ferromagnetic free layer 104 is illustrated as having a perpendicular magnetization direction 108 upwards along the z-axis. Depicting one storage state, the superparamagnetic free layer 102 has a magnetization direction 110 with an in-plane component that varies randomly in time at various angles in the plane, but that retains a magnetization direction component 110z in parallel with the magnetization direction 108 of the ferromagnetic free layer 104. Thus, rather than being anti-parallel to the ferromagnetic free layer 104, the superparamagnetic free layer 102 has a magnetization direction 110 with a component (e.g., 110z) that is in the same direction as the magnetization direction 108 of the ferromagnetic free layer 104. Due to this near alignment of superparamagnetic free layer (SPFL) with the ferromagnetic free layer (FFL), there is only a slight degradation (~5%) in TMR with respect to an MTJ without the superparamagnetic free layer 102. This is an aspect wherein the current disclosure supersedes the OST-MTJ. This randomly varying in-plane magnetization instability in the superparamagnetic free layer 102 is referred to as superparamagnetism herein and can be achieved in different ways.

In some embodiments, the superparamagnetic free layer 102 is a monocrystalline or polycrystalline layer that has a symmetric or nearly symmetric shape in the xy plane (e.g., circular 102c, square 102s, or square-like with rounded corners 102r), and that has substantial axial symmetry about a central axis 112 passing through the compound free layer 100. As noted earlier, the superparamagnetism phenomenon is subject to the strength of the thermal fluctuations, and as such, the axial symmetry herein also includes the asymmetry or irregularities up to the extent that they can be transcended by the thermal fluctuations. In these embodiments, the superparamagnetic free layer 102 has a thickness, t, that is greater than a critical thickness. This critical thickness depends on the bulk anisotropy $K_{Bulk}$, total interface anisotropy $K_I$, saturation magnetization $M_S$ and the cross-section of the ferromagnet. The former two components ($K_{Bulk}$ and $K_I$) along with the thickness of the ferromagnet regulate its anisotropy while the latter two ($K_I$ and cross-section of the ferromagnetic) again along with its thickness determine its demagnetization. For ferromagnets thicker than the critical thickness the demagnetization overrides the anisotropy to destabilize the magnetization from the z-axis, and thus this critical thickness serves as a threshold. For in-plane MTJs, the asymmetric ferromagnetic free-layer is designed to be thicker than this threshold. A strong axial asymmetry in these layers however results in shape anisotropy i.e., a preferential axis for the magnetization to relax towards. For ferromagnets thinner than the critical thickness, the ferromagnets exhibit perpendicular magnetic anisotropy and thus for such perpendicular MTJs, the thickness of the ferromagnetic free layer is designed to be thinner than the threshold value. In this disclosure, the ferromagnetic free layer 104 is designed to be thinner than its critical thickness, while another superparamagnetic free layer 102 is added whose thickness is designed to be approximately equal or slightly thicker than its respective threshold value. Since additionally this superparamagnetic free layer 102 is sufficiently symmetric in the xy plane (e.g., circular 102c, square 102s, or square with rounded corners 102r in the xy plane) there is insufficient shape anisotropy in the xy plane to provide any preferential easy-axis into which the magnetization can relax and remain in that direction. This engineers "no easy-axis effect", and renders the magnetization of the superparamagnetic free layer 102 unstable, such that the magnetization of the superparamagnetic free layer 102 randomly changes direction under the influence of thermal fluctuations. In some embodiments, the superparamagnetic free layer 102 can have a radius, r, and/or a length, 1, and width, w, which are substantially equal, and which range from 1 nm to 500 nm, and thickness from 0.3 nm to 20 nm. In some embodiments, the monocrystalline or polycrystalline superparamagnetic free layer can be comprised of a CoFeB ferromagnetic alloy (e.g., $Co_{20}Fe_{60}B_{20}$, wherein the film has a 20% cobalt content, 60% iron content, and 20% boron content, by weight), in which case the critical thickness might be approximately 1.1 to 1.7 nm (depending on the design and resulting properties of the ferromagnetic freelayer 104). In other embodiments, the monocrystalline or polycrystalline superparamagnetic free layer can be comprised of CoFe, FeB, NiFe, CoIr (e.g., $Co_{80}Ir_{20}$), or other similar ferromagnetic layers.

In other approaches, rather than the superparamagnetic free layer 102 being a single monocrystalline or polycrystalline layer, the superparamagnetic free layer 102 can be comprised of a plurality of superparamagnetic nanoparticles, each of which has a grain size (diameter) that is less than 3 nm to 50 nm. (The superparamagnetic layer(s) can even be substantially amorphous.) Like the monocrystalline or polycrystalline superparamagnetic layer, the superparamagnetic nanoparticles have magnetization directions that are unstable and randomly change direction under the influence of temperature. Despite this random change of magnetization direction, the superparamagnetic nanoparticles still retain a magnetization direction component in parallel with that of the ferromagnetic free layer 104 due to dipolar field from the ferromagnetic free layer. In some embodiments, superparamagnetic nanoparticles can be comprised of cobalt, iron, and boron, such as CoFeB (e.g., $Co_{20}Fe_{60}B_{20}$) or CoFe, FeB, or NiFe.

When previous perpendicular MTJ designers have observed instability in their free layer, they have tended to "fix" the instability by reducing the thickness and/or increasing the area of the free layer (to ensure the magnetic orientation remains firmly perpendicular) for perpendicular MTJs, and/or by increasing the shape anisotropy (e.g., to make the MTJ in more eccentric elliptical shape to ensure magnetization states are sufficiently discrete) for in-plane MTJs. In contrast, the present approach adds another ferromagnetic layer with superparamagnetism while maintaining the same ferromagnetic free layer, and uses a shape symmetric MTJ with a superparamagnetic free layer and limits the shape anisotropy, which is contrary to conventional approaches.

Figure 1C:
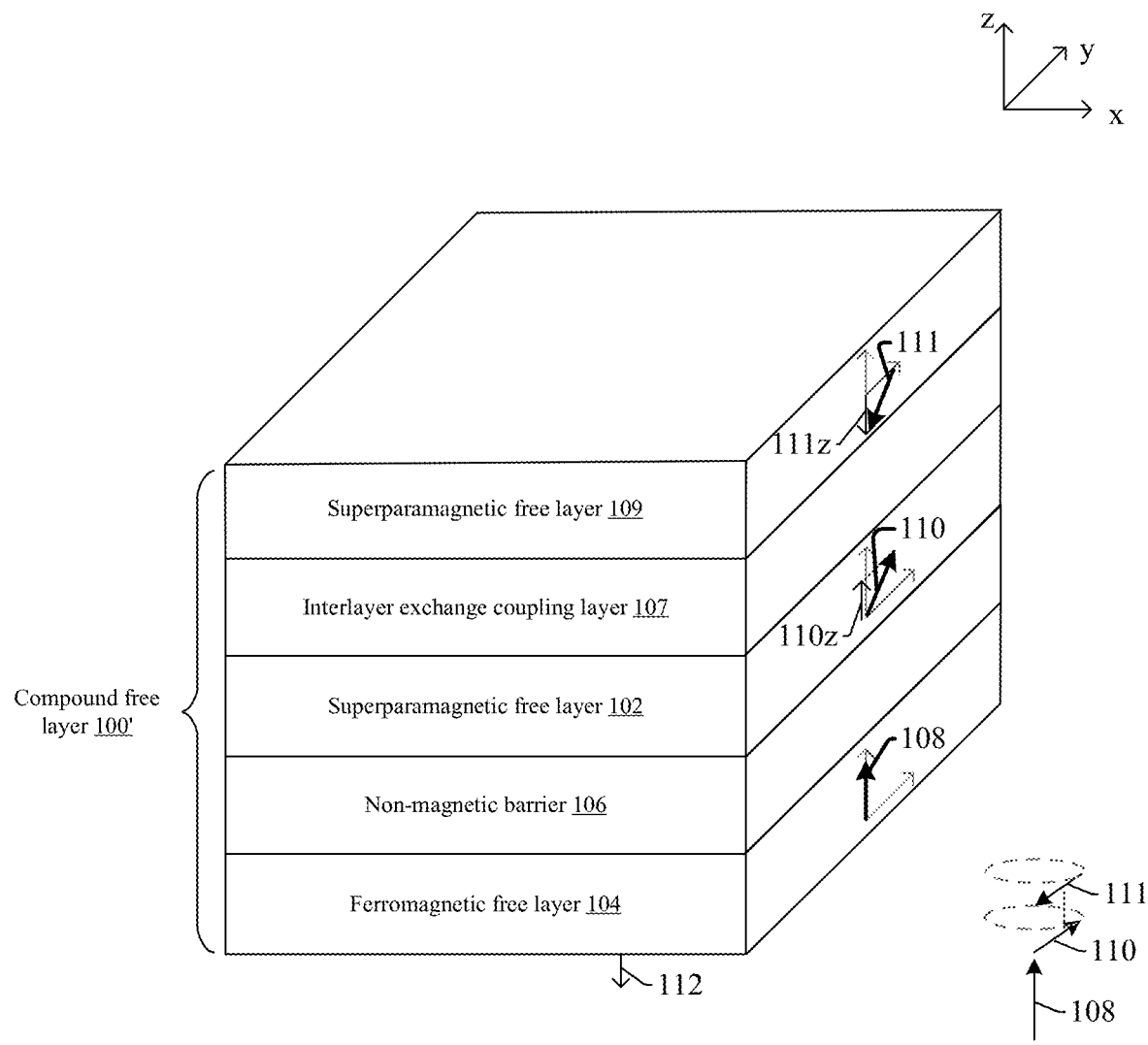
FIGS. 1C and 1D illustrate a three dimensional view of some alternative embodiments of a compound free layer, which includes a ferromagnetic free layer, a first superparamagnetic free layer over the ferromagnetic free layer, and a second superparamagnetic free layer over the first superparamagnetic layer. The magnetic moments of the two superparamagnetic sub-layers are pointed in antiparallel directions.
Figure 1D:
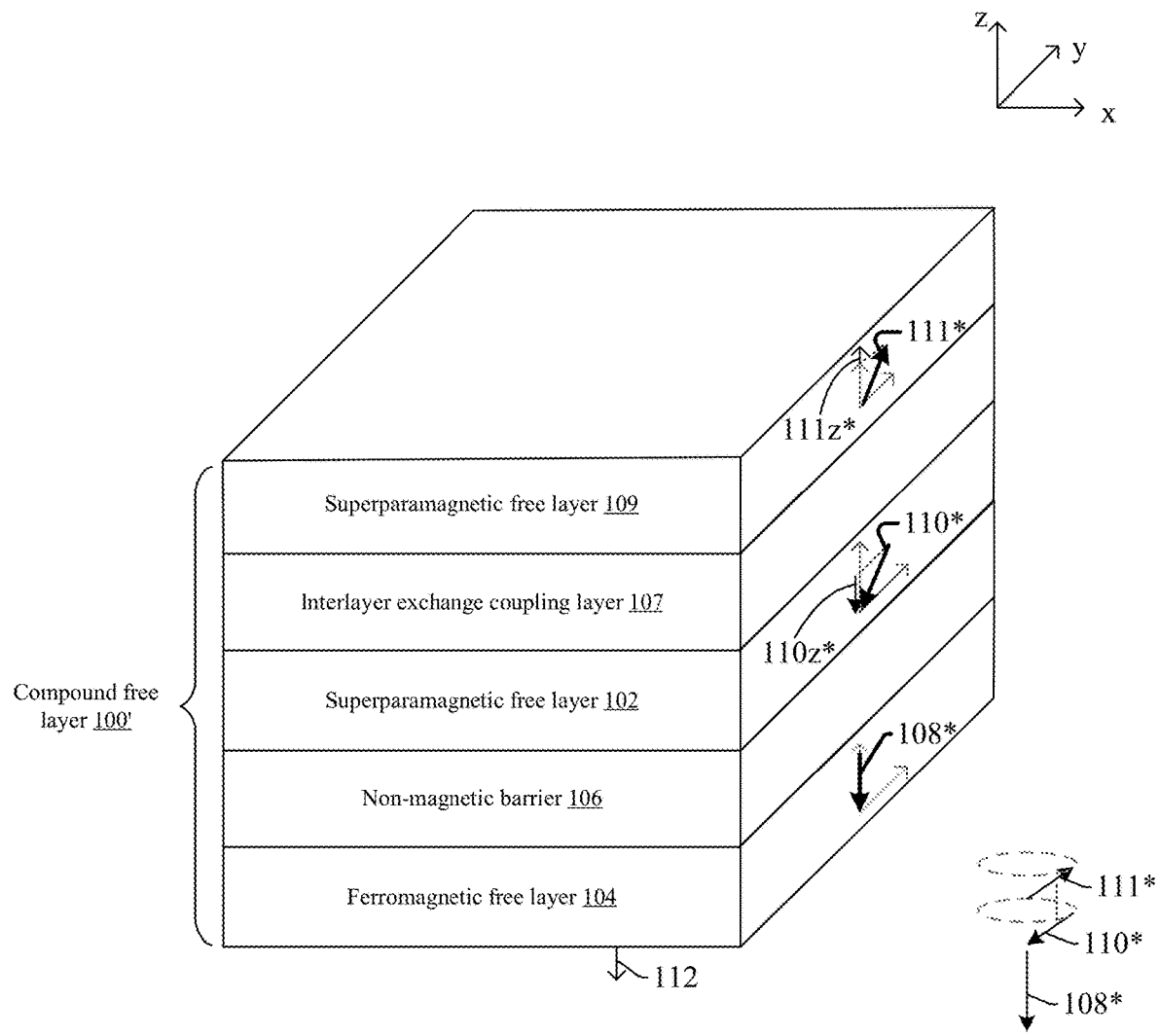

FIGS. 1C and 1D illustrate some alternative embodiments of compound free layers, which are labelled now 100'. Like FIG. 1A's embodiment, the compound free layer 100' includes a first superparamagnetic free layer 102, a ferromagnetic free layer 104, and a non-magnetic barrier layer 106 separating the first superparamagnetic free layer 102 from the ferromagnetic free layer 104. In addition, however, this compound free layer 100' also includes an interlayer exchange coupling (IEC) layer 107 over the first superparamagnetic free layer 102, and a second superparamagnetic free layer 109 over the IEC layer 107. In some embodiments, the IEC layer 107 is an intermetallic spacer such as ruthenium (Ru) or iridium (Ir), among others, that is of a thickness that provides antiparallel interlayer exchange coupling between the first and second superparamagnetic free layers 102 and 109. The first and second superparamagnetic free layers 102, 109 can have the same composition as one another in some embodiments. While the first superparamagnetic free layer 102 retains a magnetization direction component 110z in parallel with the magnetization direction 108 of the ferromagnetic free layer 104, the second superparamagnetic free layer 109 retains a magnetization direction component 111z that is anti-parallel with the magnetization direction 108 of the ferromagnetic free layer 104. Generally, the first superparamagnetic free layer 102 is designed to have a greater magnetic moment than the second superparamagnetic free layer 109 in order to better provide magnetostatic stabilization for ferromagnetic free layer 104. The embodiment shown in FIG. 1D is similar to that shown in FIG. 1C. It is for the opposite bit storage case where the free layer's magnetization 108* is reversed. Superparamagnetic free layers 102 and 109 now have their magnetization vectors 110* and 111* reversed in this second bit storage state. Due to the antiparallel exchange coupling, magnetization vectors 110 and 111 in FIG. 1C remain oppositely directed but can rotate their magnetization vectors in the x-y-plane and these are in particular free to rotate in unison. Similarly, magnetization vectors 110* and 111*' in FIG. 1D are free to rotate in unison while they each point in antiparallel directions from either other due to strong antiparallel coupling from the IEC layer 107. It will be appreciated that although the following figures and description are illustrated and described with regards to a compound free layer 100, that the compound free layer 100' can also be substituted in place of the compound free layer 100 in some embodiments.

This dual superparamagnetic free layer based design of FIGS. 1C and 1D can provide improvements over single superparamagnetic free layer based designs. Firstly, dual superparamagnetic free layers improve the switching speed. Both dipolar coupling and spin-torque between superparamagnetic free layers help dual superparamagnetic free layers to switch faster. This in turn helps FFL 104 to switch faster. Secondly, the dual superparamagnetic free layers based design improves the stability of the underlying RL due to the dipolar field from first superparamagnetic free layer 102 being significantly canceled by that from the second superparamagnetic free layer 109. Improvement in stability of ferromagnetic reference layers suppresses a back-switching problem in the MTJ which might otherwise occur. Thirdly, the dual superparamagnetic free layer based design improves the instantaneous stability of the FFL 104. In the single superparamagnetic free layer design, due to the random movement of the superparamagnetic free layer, although the average dipolar field in the xy plane is zero, the instantaneous value is still non-zero and hence instantaneous stability can be smaller than the designed value. In dual-superparamagnetic free layers design, since the first superparamagnetic free layer 102 and second superparamagnetic free layer 109 are oppositely oriented in the xy plane, their dipolar fields acting on the FFL 104 will be in opposite directions. Hence, instantaneous x-y dipolar field from first superparamagnetic free layer 102 on FFL 104 will get substantially compensated. Hence, this will improve the instantaneous stability of the FFL 104.

Figure 2A:
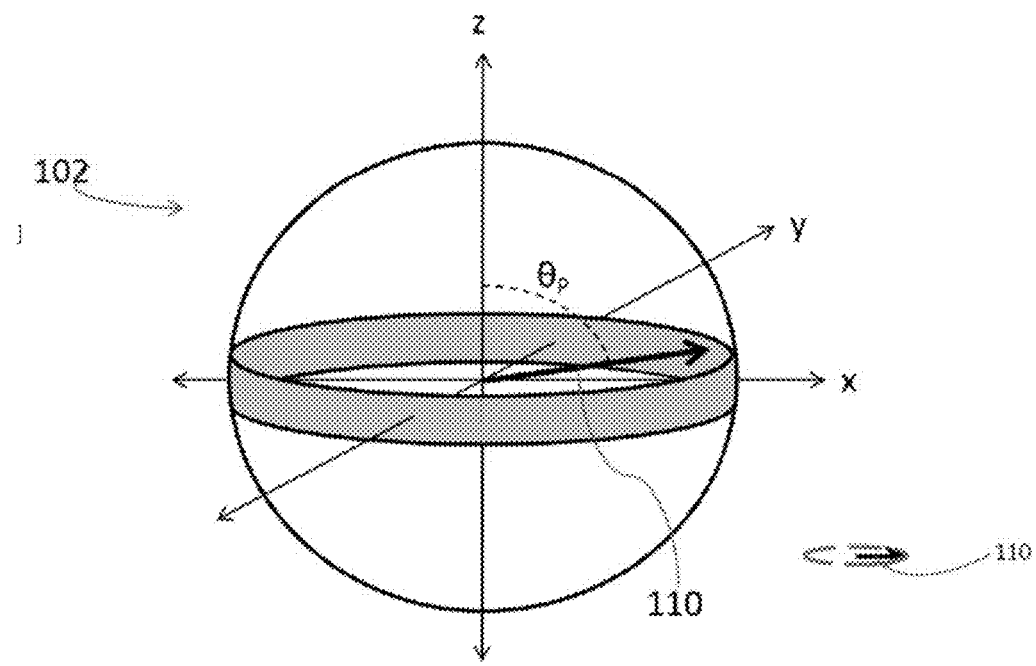
FIG. 2A illustrates a three dimensional diagram depicting a time-varying magnetization's unit-vector possible unit-vector directions within a superparamagnetic free layer in accordance with some embodiments.
Figure 2B:
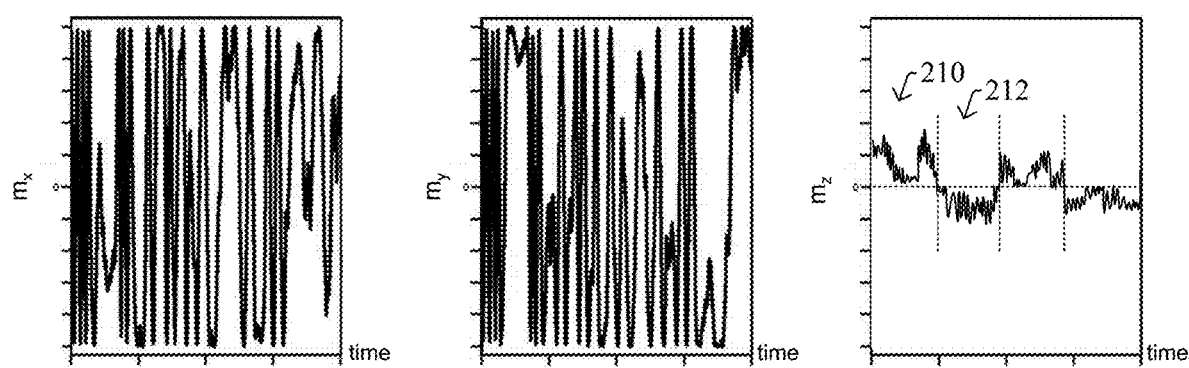
FIG. 2B illustrates the time-varying magnetization along an x axis, y axis, and z axis for the isolated superparamagnetic free layer in accordance with FIG. 2A.

FIG. 2A illustrates an example of how the magnetization direction 110 of an isolated (i.e., not in an MTJ stack and not in a compound free layer stack) superparamagnetic free layer 102 can vary in time. In this case, the magnetization direction 110 of the superparamagnetic free layer can be considered as precessing in time about the z-axis at an angle, θp, so as to remain (with a high probability) within the shaded ring-like region on the surface of a sphere, but following a precession with frequent disturbances due to thermal agitation. Due to the random thermal fluctuations, the angle, θp, and magnitudes of the magnetization along the various axes change randomly in time, especially the x- and y-components. The time-variant angle, θp, remains greater than some angle (e.g., greater than approximately 70 degrees) and less than some maximum angle (e.g., less than approximately +110 degrees as measured from the vertical pointing z-axis during precession. FIG. 2B shows results from a macrospin simulation of the behavior of the isolated superpamagnetic free layer. The left and center images show how the x- and y-components of the normalized magnetizations vary in a random like manner between +1 and −1. The right-most image shows the variation of the z-component of magnetization. In this example it has a normalized magnitude that remains below about 0.3 with a high probability. In other examples the perpendicular component of the magnetization can be adjusted to have a slightly higher magnitude, in which case the single band in FIG. 2A (shaded area) describing the high probability magnetization direction can split into two bands, offset slightly from z=0 in the positive and negative directions, with a low probability of the magnetization z-component transitioning from positive to negative. The positive or negative sub-band of the superparamagnetic freelayer 102 can be even better stabilized in the compound free layer structure described in the next paragraph.

Figure 2C:
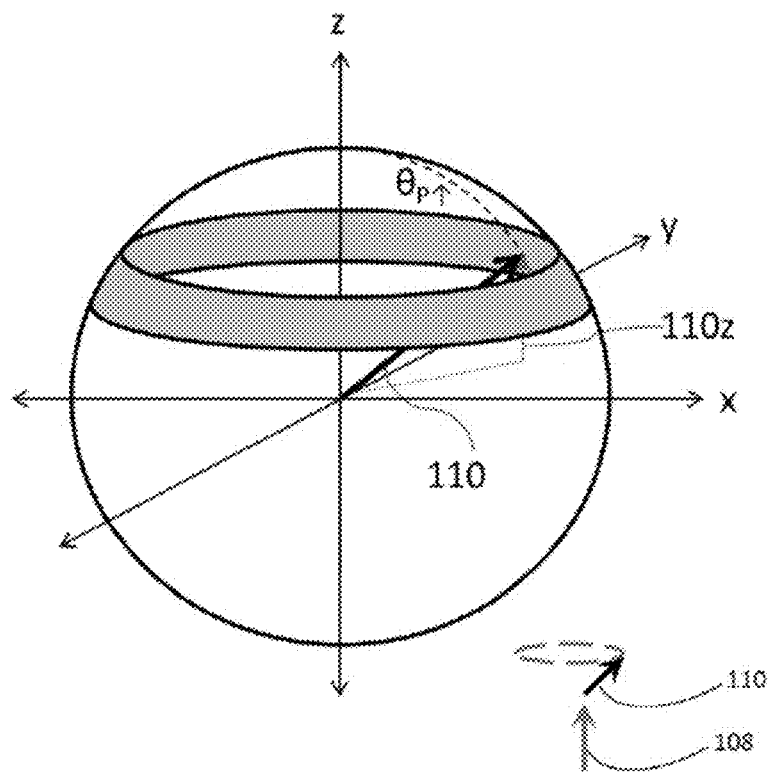
FIGS. 2C and 2D illustrate some embodiments of the possible magnetic moment directions within the superparamagnetic sublayer of a compound free layer for the cases of contributing to the storage of information in upward and downward magnetization states respectively.
Figure 2D:
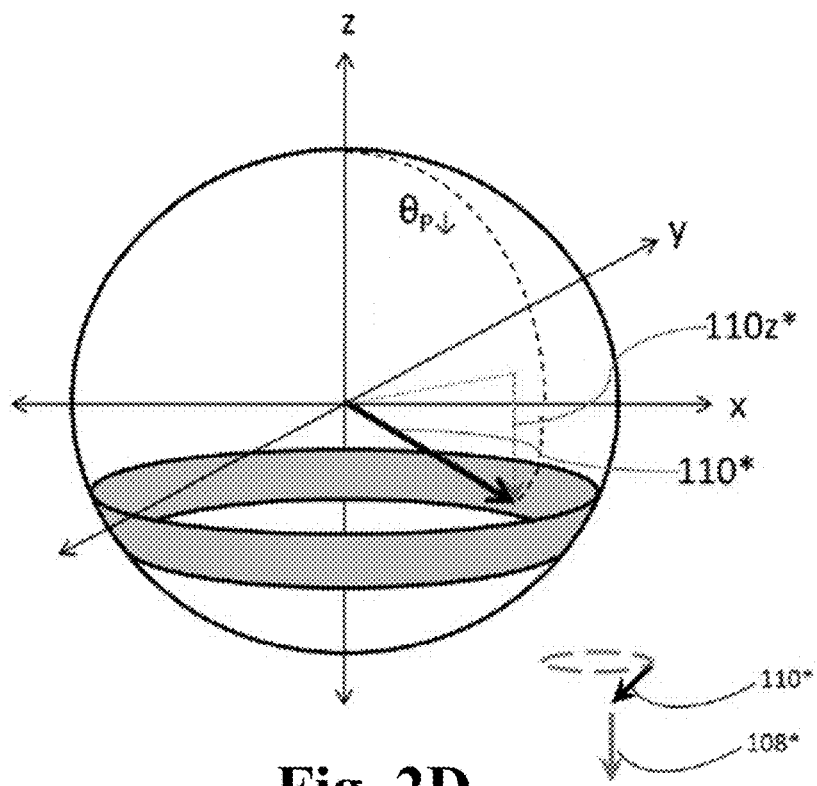

When the superparamagnetic free layer 102 is combined with a ferromagnetic free layer 104 in a compound free layer, the magneto-static interactions of the magnetic layers cause the superparamagnetic layer to have a nonzero average z component as its z-component of magnetization aligns with that of the ferromagnetic free layer (when the compound free layer is in the storage state, i.e., not in the middle of being written). This alignment was already discussed in conjunction with the discussion of magnetization vectors 108 and 110 in FIG. 1A and 108* and 110* in FIG. 1B. FIGS. 2C and 2D give more detail about the behavior of the superparamagnetic layer magnetization vectors 110 and 110*, respectively. Grey shaded rings in FIGS. 2C and 2D illustrate the range of angles these superparamagnetic free layer's magnetization vectors can assume when the adjacent ferromagnetic free layer's magnetization is in the up or down direction, respectively. In FIG. 2C, for the case when the ferromagnetic free layer's magnetization vector points up, the SPFL layer continuously retains a magnetization value keeping it roughly within the shaded ring, with the angle $\theta_{P\uparrow}$ from perpendicular varying between about 35 and 70 degrees. For the case of the ferromagnetic free layer's magnetization vector pointing down (FIG. 2D) the SPFL layer continuously retains a magnetization value keeping it roughly within the shaded ring in the lower hemisphere, with the angle $\theta_{p\uparrow}$ varying between about 110 and 145 degrees. Rather than a precession that is strictly cone-shaped, the magnetization direction 110 actually wobbles by exhibiting a random nutation in the xy plane and a random intrinsic rotation about the z axis. Because of the random "wobble", the direction of magnetization 110 actually lacks a particular shape in time and lacks an in-plane easy axis.

Hence, when the SPFL layer is in isolation, it z-value of magnetization hovers near zero. When the SPFL layer is incorporated into a compound free layer, its z-component value is positive or negative reflecting the magnetization vector component that is in alignment with the positive or negative z-direction of the ferromagnetic free layer's magnetization. In the storage state, the SPFL layer in effect becomes an assist layer stabilizing the up or down direction of ferromagnetic free layer's moment, behaving to an extent as a "magnetic keeper" for the ferromagnetic free layer's magnetization. Later we will describe additional advantages of the SPFL layer, which are for assisting the write operation of the compound free layer structure (i.e., when not in the storage state).

Figure 3A:
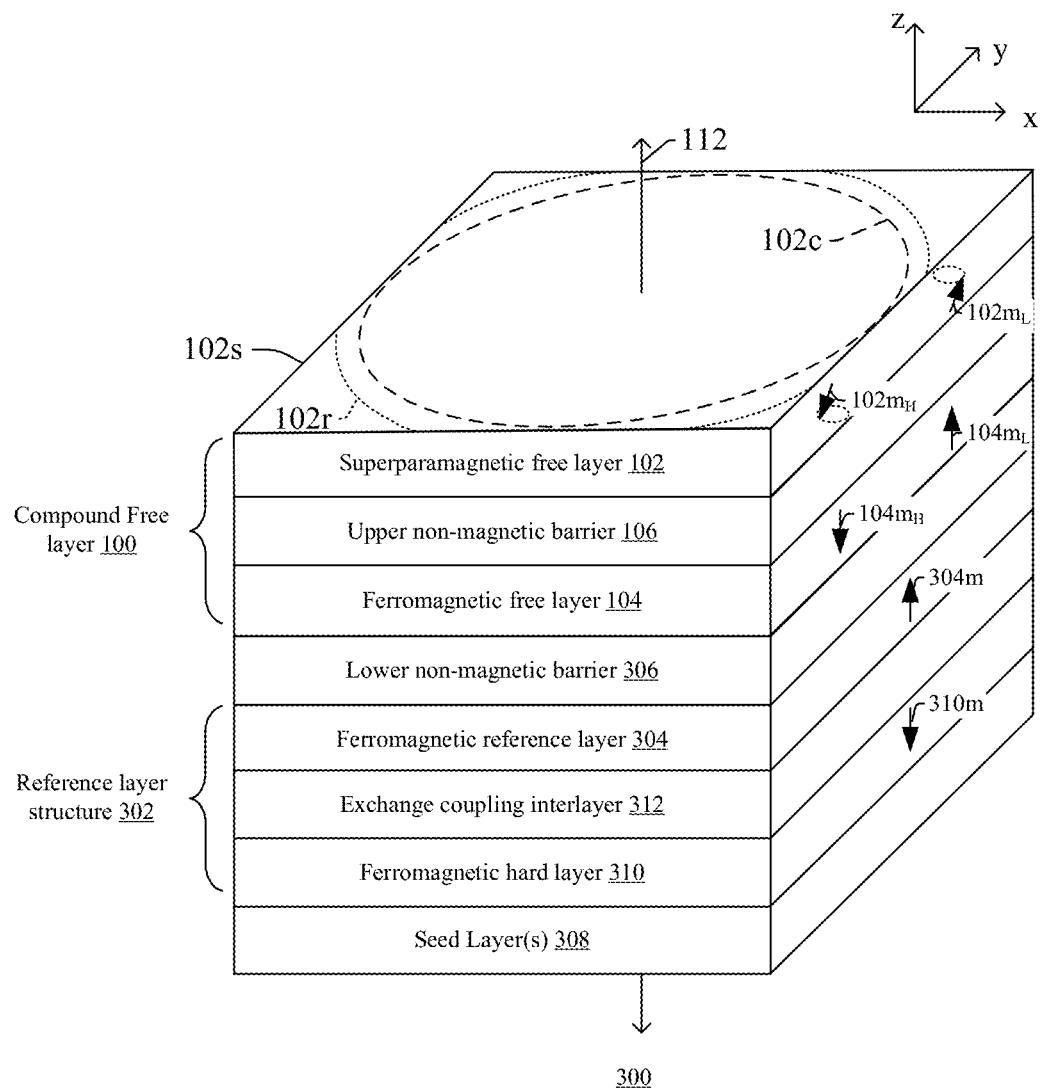
FIG. 3A illustrates a three dimensional view of some embodiments of a magnetic tunnel junction stack that includes a compound free layer with a superparamagnetic free layer sublayer.

FIG. 3A illustrates a ferromagnetic memory stack 300 in accordance with some embodiments. The ferromagnetic memory stack 300 includes seed layer(s) 308, a reference layer structure 302, a lower non-magnetic barrier layer 306, and a compound free layer 100 over the ferromagnetic reference layer 304. The compound free layer 100 includes a ferromagnetic free layer 104, and a superparamagnetic free layer 102 over the ferromagnetic free layer 104.

In some embodiments, the reference layer structure 302 is a multi-layer structure comprised of a ferromagnetic reference layer 304 over an exchange coupling interlayer 312 which in turn is over a ferromagnetic hard layer (i.e., fixed hard layer) 310. The exchange coupling interlayer 312 may be comprised of Ru or Ir. The magnetization direction 310m of the ferromagnetic hard layer 310 is constrained or "fixed" due to its strong perpendicular anisotropy (and an initializing exposure to a high magnetic field after an entire wafer or chip is manufactured). The ferromagnetic hard layer 310 may be comprised of a repeated multilayer of Pt/Co, Pd/Co, or Ni/Co, and the interlayer exchange coupling interlayer 312 may be comprised generally of ruthenium (Ru) or iridium (Ir). The exchange coupling interlayer 312 has a predetermined thickness, which introduces a strong anti-parallel magnetic coupling between the ferromagnetic hard layer 310 and the ferromagnetic reference layer 304. For example, in some embodiments where the exchange coupling interlayer 312 is a ruthenium (Ru) or iridium (Ir) layer, the exchange coupling interlayer 312 has a thickness ranging from 3 Angstroms to approximately 25 Angstroms that is known to result in strong anti-parallel coupling. In some embodiments, thicknesses for strong antiparallel coupling are approximately 4.2 to 5.1 Angstroms for an iridium spacer, 4.0 to 4.5 for a thin ruthenium spacer, or 8 to 11 Angstroms for a thicker ruthenium spacer, in descending order of coupling strength. Generally, the strongest coupling and a wider process window are preferred.

The ferromagnetic reference layer 304 is a ferromagnetic layer that has a magnetization direction 304m that is "fixed". In some embodiments, the ferromagnetic reference layer 304 is a CoFeB layer. It can even be multi-layered including layers of Co or FeB for example and it may be graded, and may even include doping or a thin insertion layer from transition metals like W, Ta, Mo, Hf, V, etc. Such types of reference layers are sometimes called composite layers in the literature, or sometimes referred as a set of reference layers, spacers and hard or pinned hard layers. The magnetic moment of the ferromagnetic reference layer 304 is opposite to that of the ferromagnetic hard layer 310 due to the antiparallel exchange coupling provided by the exchange coupling interlayer 312. For example, in the example of FIG. 3A, the magnetization direction 310m of the ferromagnetic hard layer 310 is illustrated as pointing upward and the magnetization direction 304m is illustrated as pointing downward along the z axis. In other embodiments these magnetization directions could be "flipped" so 310m points upward and 304m points downward.

A lower non-magnetic barrier layer 306, such as a thin dielectric layer or non-magnetic metal layer can separate the ferromagnetic reference layer 304 from the ferromagnetic free layer 104. In some embodiments, the lower non-magnetic barrier layer 306 can be comprised of an amorphous barrier, such as aluminum oxide ($AlO_x$) or titanium oxide ($TiO_x$), or a crystalline barrier, such as magnesium oxide (MgO) or a spinel (e.g., $MgAl_2O_4$). The lower non-magnetic barrier layer 306 can have the same composition as or a different composition than the upper non-magnetic barrier layer 106. In embodiments where the ferromagnetic memory stack is an MTJ, the lower non-magnetic barrier layer 306 is a tunnel barrier which is thin enough to allow quantum mechanical tunneling of current between the ferromagnetic free layer 104 and ferromagnetic reference layer 304. In some embodiments, the upper non-magnetic barrier layer 106 is a non-magnetic metal. Examples of non-magnetic metals include, but are not limited to: copper, aluminum, lead, tin, titanium and zinc; alloys such as brass and bronze; and precious metals such as gold and silver.

The ferromagnetic free layer 104 is capable of having its magnetization direction changed between two stable magnetization states, which are along an axis direction referred to as the easy-axis of the magnet. Depending on which of the two directions along the easy-axis the magnetization relaxes into, the MTJ has different resistances which correspond to binary data states stored in the memory cell. For example, in a first state (first set of arrows rightmost n FIG. 3A), the ferromagnetic free layer 104 can have a first magnetization direction in which the magnetization direction $104m_L$ of the ferromagnetic free layer 104 is aligned in parallel with the magnetization direction 304m of the ferromagnetic reference layer 304, thereby providing the ferromagnetic memory stack 300 with a relatively low resistance. Thus, in this first state (or parallel state, "P"), the magnetization direction of compound free layer 100 can be made up of a magnetization direction $104m_L$ of the ferromagnetic free layer 104 and a magnetization direction $102m_L$ of the superparamagnetic free layer 102. For the first state, the magnetization direction $104m_L$ of the ferromagnetic free layer 104 points in parallel with the magnetization direction of the ferromagnetic reference layer 304m. Also in this first state, the superparamagnetic free layer 102 has a magnetization direction $102m_L$ that, while varying randomly in time (in the planar directions as illustrated by the dotted rings in FIG. 3A) because of thermal interactions, retains a magnetization component that is in parallel with the magnetization direction of the ferromagnetic reference layer 304m. These magnetization directions 310m, 304m, $104m_L$, $102m_L$ result in the ferromagnetic memory stack 300 having a first resistance that is relatively low, e.g., 3 to 10 kilo-ohms.

In a second state (second set of arrows to the left in FIG. 3A), the ferromagnetic free layer 104 can have a first magnetization direction in which the magnetization of the ferromagnetic free layer 104 is aligned anti-parallel with the magnetization direction 304m of the ferromagnetic reference layer 304, thereby providing the ferromagnetic memory stack 300 with a relatively high resistance, e.g., 6 to 30 kilo-ohms. Thus, in the second state, magnetization direction of the compound free layer 100 can be made up of a magnetization direction $104m_H$ of the ferromagnetic free layer 104 and a magnetization direction $102m_H$ of the superparamagnetic free layer 102. For the second state, the magnetization direction $104m_H$ of the ferromagnetic free layer 104 can point anti-parallel to the magnetization direction of the ferromagnetic reference layer 304m. Also in this second state, the superparamagnetic free layer 102 has a magnetization direction $102m_H$ that varies randomly in time in the in-plane (x,y) directions because of thermal interactions, but which retains a magnetization component that is anti-parallel with the magnetization direction of the ferromagnetic reference layer 304m and in parallel with the magnetization direction $104m_H$ of the ferromagnetic free layer 104. These magnetization directions 310m, 304m, 104$m_H$, and 102$m_H$ result in the ferromagnetic memory stack 300 having a second resistance that is higher than the first resistance.

An upper non-magnetic barrier layer 106, such as a dielectric layer or non-magnetic metal layer, can separate the ferromagnetic free layer 104 from the superparamagnetic free layer 102. The upper non-magnetic barrier layer 106 can be comprised of an amorphous barrier, such as aluminum oxide (AlO$_x$) or titanium oxide (TiO$_x$), or a crystalline barrier, such as magnesium oxide (MgO) or a spinel (e.g., MgAl$_2$O$_4$). In most embodiments, the non-magnetic barrier layer 106 is a thin tunnel barrier which is thin enough to allow quantum mechanical tunneling of current between the superparamagnetic free layer 102 and the ferromagnetic free layer 104. In some other embodiments, the upper non-magnetic barrier layer 106 can be a non-magnetic metal such as tantalum, tungsten, molybdenum, copper, chromium, magnesium, aluminum, lead, tin, titanium and zinc; alloys such as brass and bronze; and precious metals such as gold and silver, or 2D materials like transition metal dichalcogenides (TMDs) like MoS$_2$, WS$_2$, etc. In one embodiment, the upper and lower non-magnetic barrier layers 106 and 306 might be made of crystalline or polycrystalline MgO with a strong [001] texture, with the tunneling resistance of the upper barrier being substantially (e.g., more than four times) less than that of the lower barrier.

In some embodiments, the seed layer 308 is comprised of a Ta/Pt or a Ru/Pt bilayer or a tri-layer made of TaN, Mg, and Pt or of Ta, Ru, and Pt. In some embodiments the seed layer may include a NiCr sublayer. A function of the seed layers in some embodiments is to promote growth of a smooth ferromagnetic hard layer, often with a strong [111] texture, which in turn leads to strong perpendicular magnetic anisotropy for the ferromagnetic hard layer 310.

In some embodiments, the superparamagnetic free layer 102 directly contacts the upper non-magnetic barrier layer 106, and the upper non-magnetic barrier layer 106 directly contacts the ferromagnetic free layer 104. In some embodiments, each of the superparamagnetic free layer 102, the upper non-magnetic barrier layer 106, and the ferromagnetic free layer 104 are substantially cylindrically shaped and have substantially equal radii. In other embodiments, each of the superparamagnetic free layer 102, the upper non-magnetic barrier layer 106, and the ferromagnetic free layer 104 are square-shaped, with or without rounded corners, or circular and have substantially equal radii/distances from their centers to outermost edges. A common central axis 112 passes linearly through respective central portions of the superparamagnetic free layer 102, the upper non-magnetic barrier layer 106, the ferromagnetic free layer 104, the ferromagnetic reference layer structure 302, respectively. The superparamagnetic free layer 102, the upper non-magnetic barrier layer 106, the ferromagnetic free layer 104, the ferromagnetic reference layer 304, and the ferromagnetic hard layer structure 310 are axially symmetric about the common central axis 112. It is noted that strict symmetry is not mandatory, and thus in some embodiments substantial symmetry or near symmetry is present. Further, in any patterned MTJ, there is tapering due to process limitations. So even if there is axial symmetry, the radii or cross-section of all layers need not be exactly the same. In addition, in some embodiments, the axial symmetry need not be maintained for the ferromagnetic reference layer structure 302 sublayers. Rather the reference layer structure 302 sublayers may extend out beyond the dimensions of the superparamagnetic free layer 102, the upper non-magnetic barrier layer 106, and the ferromagnetic free layer 104, and may extend so in a non-axially symmetric manner.

FIGS. 3B-3G provide several examples of MTJ memory cell stack embodiments. To the right of each MTJ stack in FIGS. 3B-3G, the magnetization directions for the various layers are shown next to the layer for two data states (e.g., a high resistance (HR) state and a low-resistance (LR) state).

Figures 3B, 3C:
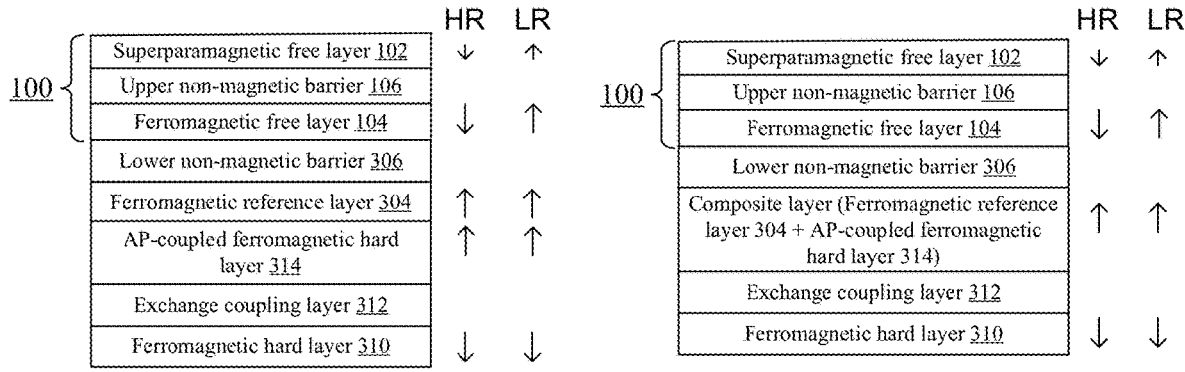
FIGS. 3B-3G illustrate some alternative embodiments for MTJ stack structures for MTJ memory cells.

In FIG. 3B, which corresponds to a case of FIG. 3A with an added ferromagnetic layer 314 between the exchange coupling layer 312 and the ferromagnetic reference layer 304, 314 is antiparallel (AP) coupled with the ferromagnetic hard layer 310 but parallel coupled with ferromagnetic reference layer 304. The AP coupled ferromagnetic hard layer 314 and the ferromagnetic reference layer 304 form a composite magnetic layer as illustrated in FIG. 3C. The composite magnetic layer and the ferromagnetic hard layer 310 are anti-ferromagnetically coupled, such that 304, 314, 312, and 310 collectively form a synthetic anti-ferromagnet (SAF). This coupling is due to 312, which may be a transition metal with strong Ruderman-Kitel-Kasuya-Yoshida (RKKY) interlayer exchange coupling strength, such as Ruthenium or Iridium. Here, one of the ferromagnetic layers in the SAF is actually a composite layer (304+314), and in itself can be graded or multi-layered with even more layers. Its top region in vicinity of non-magnetic barrier layer 306 serves as a reference layer, while its lower region in vicinity of metallic interlayer 312 serves as a hard layer that is also anti-ferromagnetically coupled to the ferromagnetic hard layer 310.

FIG. 3C illustrates more explicitly that 304 and 314 behave as one composite magnetic layer. The composite layer is anti-ferromagnetically coupled to the ferromagnetic hard layer 310 though the exchange coupling layer 312 to collectively form a synthetic anti-ferromagnet (SAF). This exchange coupling is due to 322, which can be a transition metal, such as Ruthenium or Iridium with a thickness that promotes strong antiparallel magnetic coupling though the RKKY interlayer exchange interaction.

Figures 3D, 3E:
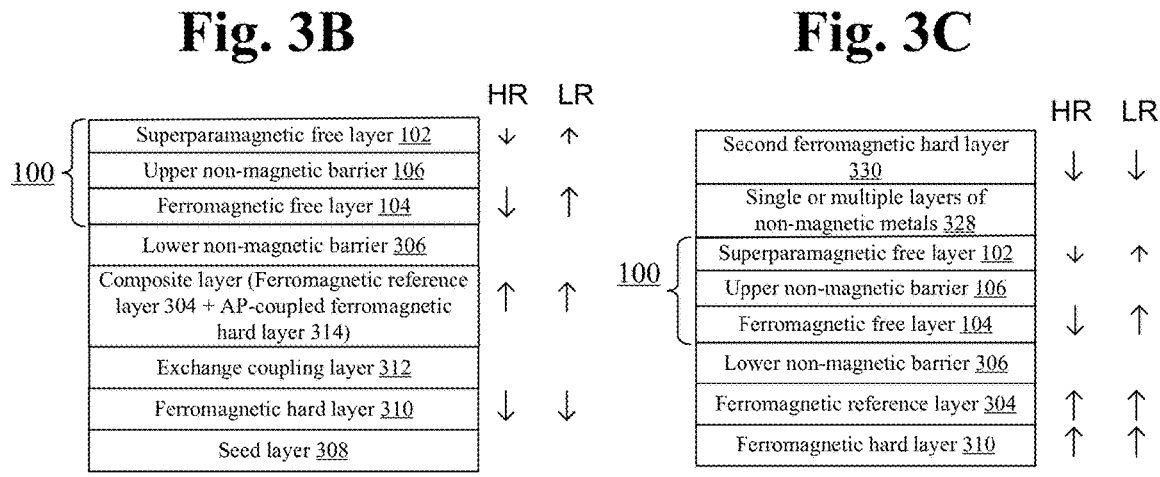

FIG. 3D is an alternate representation of FIG. 3C that additionally illustrates a seed layer under the ferromagnetic hard layer 310. The seed layer 308 is used to promote adhesion, smoothness, and strong perpendicular hard magnetic anisotropy in the ferromagnetic hard layer 310, which can be due to strong <111> texture. It can be a multilayer and may contain layers of Pt, Ta, TaN, CoFeB, and NiCr.

Figures 3F, 3G:
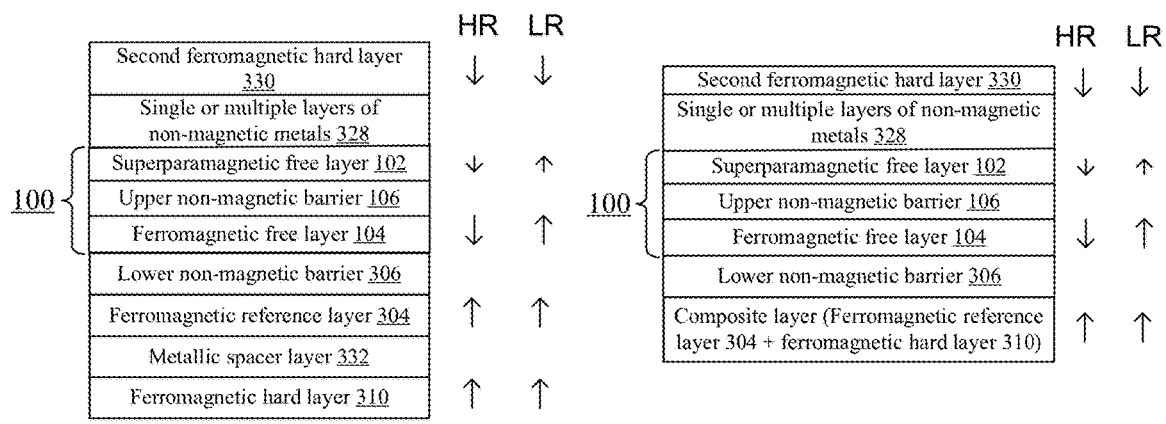

FIGS. 3A to 3D all show embodiments where the moment of the reference layer, e.g. 304 (or the composite layer containing 304 discussed above) is opposite to that of the ferromagnetic hard layer. The magnetic fields from these two layers largely cancel each other in the vicinity of the composite ferromagnetic free layer 104 and superparamagnetic freelayer 102. (A largely canceled field in the vicinity of the composite free layer is beneficial for the memory device being tolerant to disturbances from external magnetic fields.) FIG. 3E to 3G illustrate an alternative field cancellation scheme. In this case the ferromagnetic reference layer 304's moment is coupled in a parallel direction with the ferromagnetic hard layer 310's moment, but in the vicinity of the free layer the fields from these two layers are largely cancelled by a second ferromagnetic hard layer 330 located above the superparamagnetic free layer 102, separated from this layer by single or multiple layers of non-magnetic metals 328. Layers 328 do not induce exchange coupling with the superparamagnetic free layer and but do promote growth of a smooth <111> textured second ferromagnetic hard layer.

FIG. 3F is an alternate representation of FIG. 3E with explicit illustration of the spacer metallic layer 332. In some embodiments spacer metallic layer 332 can be made with Ru or Ir, but with a thickness (e.g., approximately 3 to 4 or else 12 to 13 Angstroms) that induces a parallel RKKY exchange coupling between the ferromagnetic hard layer 310 and the ferromagnetic reference layer 304.

FIG. 3G is an alternate representation of FIG. 3F where a composite layer subsumes the ferromagnetic reference layer 304, the (optional) spacer metallic layer 332, and the ferromagnetic hard layer 310.

FIGS. 4A and 5A show some embodiments of how a ferromagnetic memory stack, such as ferromagnetic memory stack 300 of FIG. 3A, can be switched between a high-resistance state and a low-resistance state, and vice versa. In particular, FIG. 4A illustrates a transition from a high-resistance state (left-side of FIG. 4A) to a low-resistance state (right-side of FIG. 4A); while FIG. 5A illustrates a transition from a low-resistance state (left-side of FIG. 5A) to a high-resistance state (right-side of FIG. 5A). The ferromagnetic memory stack 300 includes a ferromagnetic hard layer 310, an antiparallel exchange coupling layer 312 over the ferromagnetic hard layer 310, a ferromagnetic reference layer 304 over the ferromagnetic hard layer 310, and a compound free layer 100 over the ferromagnetic reference layer 304 and non-magnetic barrier layer 306. The compound free layer 100 can include a ferromagnetic free layer 104, and superparamagnetic free layer 102 over the ferromagnetic free layer 104. An upper non-magnetic barrier layer 106, such as a dielectric layer or a non-magnetic metal layer or a 2D material, can separate the superparamagnetic free layer 102 from the ferromagnetic free layer 104, and a lower non-magnetic barrier layer 306, such as a dielectric layer, can separate the ferromagnetic reference layer 304 from the ferromagnetic free layer 104.

In FIG. 4A, the central graph depicts the z-component of the unit-vector of the magnetization $m_z$ versus time for the reference layer (RL), ferromagnetic free layer (FFL), and superparamagnetic free layer (SPFL), as the ferromagnetic memory stack 300 is switched from a high resistance state (time interval 402 in graph, see also ferromagnetic memory stack in left side of FIG. 4A) to a low resistance state (404 in graph, see also ferromagnetic memory stack in right side of FIG. 4A).

In the high resistance state at time 402, the reference layer 304 has a magnetization direction that is pointing up (304$m$), the ferromagnetic free layer 104 has a magnetization direction 104$m_H$ pointing down, and the superparamagnetic free layer 102 has a magnetization direction 102$m_H$ that is precessing randomly, but retains a magnetization direction with a magnetization component that remains in parallel with the magnetization of the ferromagnetic free layer 104. Hence, the superparamagnetic free layer 102 does not stabilize its in-plane direction, but since a dipolar coupling exists between the ferromagnetic free layer 104 and the superparamagnetic free layer 102, such that in the stable states (not in the midst of the writing process) at least some component of the superparamagnetic free layer 102 remains continuously in parallel with the magnetization direction of the ferromagnetic free layer 104. This ensures a positive feedback that improves the overall stability of the compound free layer 100 for data retention.

Then, during time 406, a current density pulse $i_{HtoL}$ is applied to switch the ferromagnetic memory stack 300 from the high resistance state 402 to a low resistance state 404. The current density pulse $i_{HtoL}$ passes from the superparamagnetic free layer 102 to the ferromagnetic hard layer 310, meaning that electrons (which flow opposite to the direction of the electrical current by convention) flow from the ferromagnetic hard layer 310 to the superparamagnetic free layer 102. As can be seen from the central graph in FIG. 4A, this current pulse $i_{HtoL}$ changes the magnetization direction of the ferromagnetic free layer 104 and the superparamagnetic free layer 102, such that the magnetization directions of the superparamagnetic free layer 102 and ferromagnetic free layer 104 are in the same direction as the reference layer 304 in low resistance state during 404. In this example, for the low resistance state, reference layer 304, ferromagnetic free layer 104, and superparamagnetic free layer 106 are each close to +1 for $m_z$ (the superparamagnetic layer's $m_z$ being not quite +1 due to its in-plane components), however, in other embodiments, reference layer 304, ferromagnetic free layer 104 and superparamagnetic free layer 102 could each be close to −1 (still parallel) to give the low resistance state 404. In some embodiments, $i_{HtoL}$ has a magnitude ranging from approximately 0.5 MA-cm$^{-2}$ to approximately 60 MA-cm$^{-2}$ and a write pulse duration ranging from 0.5 ns to 250 ns or more.

Despite STT being the underlying physics, the operation mechanism for this switching of the compound free layer 100 in FIG. 4A from AP-to-P state, differs quite significantly from that of other MTJs. During time 406, observe that due to the parallel-oriented incident spin-flux from the FFL to the SPFL, the SPFL first tends to stabilize along the z-axis instead of switching. On the other hand, the FFL receives anti-parallel oriented spin-flux both from the RL (incident) and the SPFL (reflected) which helps to trigger the switching of FFL. The non-zero angle between reflected spin-flux vector from the SPFL and magnetic moments of the FFL help to incubate the switching, while the large magnitude of incident flux from RL helps in quick transition. As the time initially progresses in region 406, the SPFL's magnetization vector aligns with z-axis while the FFL's magnetization vector has already moved close to or across the xy plane (i.e., $m_z$ of the FFL crosses zero in the center figure of 4A). This again results in a large angle between spin-flux vector from SPFL and the magnetic moments of FFL which enables FFL to transition rapidly into P-state. As FFL crosses through the x-y plane the spin-flux incident on SPFL due to FFL changes sign, which now causes the SPFL magnetization vector to start to reverse direction. This is further assisted by favorable dipolar field from FFL acting upon SPFL. Together this results in very sharp toggling of the SPFL. Subsequent to switching (while the write current is still flowing), the SPFL remains completely aligned along the z-axis due to incident flux from the FFL. It is after the pulse is turned off in region 404, that the SPFL starts to relax away from z-axis and move randomly due to superparamagnetism in the xy directions. Furthermore, subsequent to switching of the SPFL but while the write current is still flowing, the reflected flux from the SPFL that acts upon FFL is anti-parallel to the desired state and thus slightly slows down complete switching of FFL, i.e., the last 10-20%. This switching gets completed due to anisotropy of the FFL when the pulse is turned off in region 407. The switching time of the magnet however corresponds to the time it takes the magnet to switch from its easy axis to the last time the magnetization crosses over the orthogonal plane, and thus the slow-down in last phase of the FFL switching does not affect the switching time of the AP-to-P state switching. In summary, for AP-to-P state switching, first the SPFL helps to incubate switching of the FFL, then the FFL switches which then influences the SPFL to switch, however the SPFL completes its switching first and the FFL completes only when the electrical stimulus is withdrawn.

Although in the description above we have focused primarily on the precessional (ultra-fast switching, less than about 10 to 20 ns) regime, the MTJ ferromagnetic memory stack 300 with the compound free layer 100 also can outperform other MTJs in the thermal regime, i.e. for slow switching.

Figure 4B:
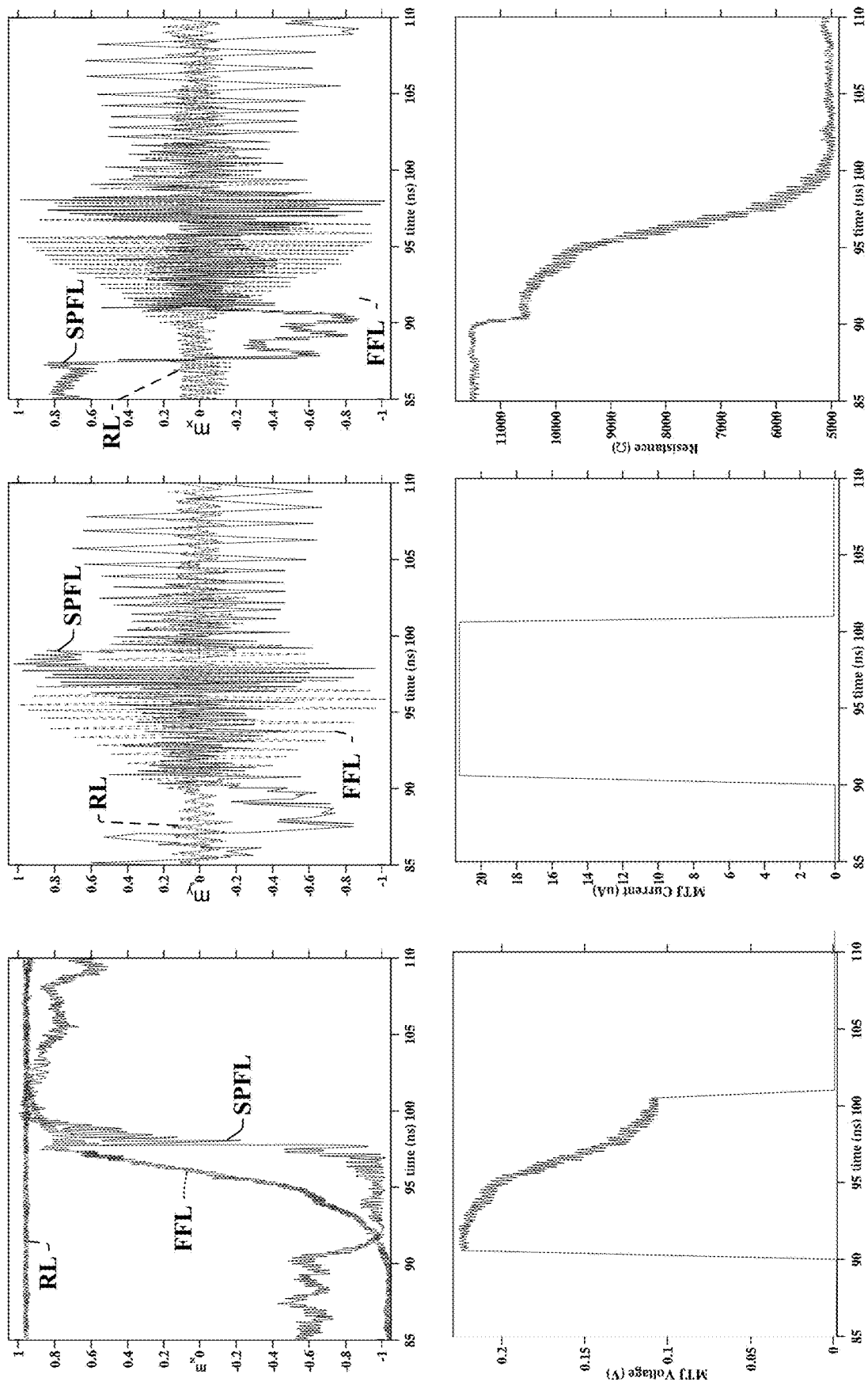
FIG. 4B illustrates an example of more detailed waveforms for some magnetic layers of a magnetic tunnel junction stack being written from a high resistance state to a low resistance state in accordance with some embodiments.

FIG. 4B depicts more detailed waveforms from the example just described in FIG. 4A in which the MTJ switches from an anti-parallel-state to a parallel state. The magnetization components of the RL, FFL and SPFL layers along the z, y, and x axes are illustrated in the top waveforms; and the MTJ voltage, MTJ current, and MTJ resistance are shown at corresponding times in the bottom waveforms.

The central graph of FIG. 5A depicts magnetization direction $m_z$ versus time for the reference layer (RL), ferromagnetic free layer (FFL), and superparamagnetic free layer (SPFL), as the ferromagnetic memory stack 300 is switched from a low resistance (parallel) state (time interval 502 in graph, see also ferromagnetic memory stack 300 in left side of FIG. 5A) to a high resistance (antiparallel) state (504 in graph, see also ferromagnetic memory stack 300 in right side of FIG. 5A).

In the low resistance state, the reference layer 304 has a magnetization direction that is pointing up (304m), the ferromagnetic free layer 104 has a magnetization direction $104m_L$ pointing up, and the superparamagnetic free layer 102 has a magnetization direction $102m_L$ that is precessing randomly, but retains a magnetization direction with a magnetization component that remains in parallel with that of the ferromagnetic free layer 104. Hence, the superparamagnetic free layer 102 does not stabilize in-plane, but a dipolar coupling exists between the ferromagnetic free layer 104 and the superparamagnetic free layer 102, such that in the stable states (not in the midst of the writing process) at least some component of the superparamagnetic free layer 102 remains continuously in parallel with the magnetization direction of the ferromagnetic free layer 104. This ensures a positive feedback which improves the overall stability of the compound free layer 100 for data retention.

Then, during time 506, a current density pulse $i_{LtoH}$ is applied to switch the ferromagnetic memory stack from the low resistance state to a high resistance state. The current density pulse $i_{LtoH}$ passes from the ferromagnetic hard layer 310 to the superparamagnetic free layer 102, meaning that electrons (which flow opposite to the direction of the current by convention) flow from the superparamagnetic free layer 102 to the hard layer 310. As can be seen from the central graph, this current pulse changes the magnetization direction of the ferromagnetic free layer 104 and the superparamagnetic free layer 102, such that the "z" magnetization directions of the superparamagnetic free layer 102 and ferromagnetic free layer 104 are anti-parallel to the ferromagnetic reference layer 304. In this example, for the high resistance state, the reference layer 304, ferromagnetic free layer 104, and superparamagnetic free layer 102 are each close to −1 for $m_z$ (the superparamagnetic layer's $m_z$ being not quite −1 due to its in-plane components), however, in other embodiments, ferromagnetic free layer 104 and superparamagnetic free layer 102 could each be close to +1 (still parallel) to give the high resistance state, provided they are anti-parallel to reference layer. In some embodiments, $i_{LtoH}$ has a magnitude ranging from approximately 0.8 MA-cm$^{-2}$ to approximately 60 MA-cm$^{-2}$ and a write pulse duration ranging from 0.5 ns to 250 ns or more.

The operation mechanism of this P-to-AP transition of this MTJ embodiment is different from its AP-to-P state transition mechanism. In this case, in time-region 506, the SPFL receives anti-parallel (reflected) spin-flux from the FFL, and the magnetic moments of the SPFL are at non-zero angle with the spin-flux vector, the combination of which helps to switch SPFL rapidly. During this initial time within 506, the FFL receives tilted-nearly-parallel-oriented incident spins from the SPFL, and reflected anti-parallel oriented spin-vectors from RL. Since, these spin-vectors have opposite projection along the z-axis they partially cancel out and somewhat initially suppress the switching of the FFL. Once SPFL crosses over xy-plane, the spin-vectors from both the SPFL and the RL, the angle between spin-vectors and magnetic moments of the FFL, and the dipolar field are all conducive for promoting the switching of the FFL. This rapidly toggles the FFL, with a switching that surpasses that of the SPFL. However, at this stage of the transition, the dipolar field from the FFL acting upon the SPFL and the reflected spin-flux from FFL acting upon SPFL oppose each other and vie to "pull" the SPFL in opposite directions. Hence, as long as electrical stimulus is active the SPFL's magnetization remains near the xy-plane and wobbles around with a direction mostly within the plane. When the electrical stimulus is turned-off in time region 504, the spin flux is gone and the dipolar field from the FFL acting upon the SPFL eventually pulls it to be along the direction of the FFL magnetization. In summary, for P-to-AP state switching, first the FFL helps to incubate switching of the SPFL, then the SPFL switches which then helps the FFL to switch, the FFL completing its switching first and the SPFL completing its switching only after the electrical stimulus is withdrawn.

Figure 5B:
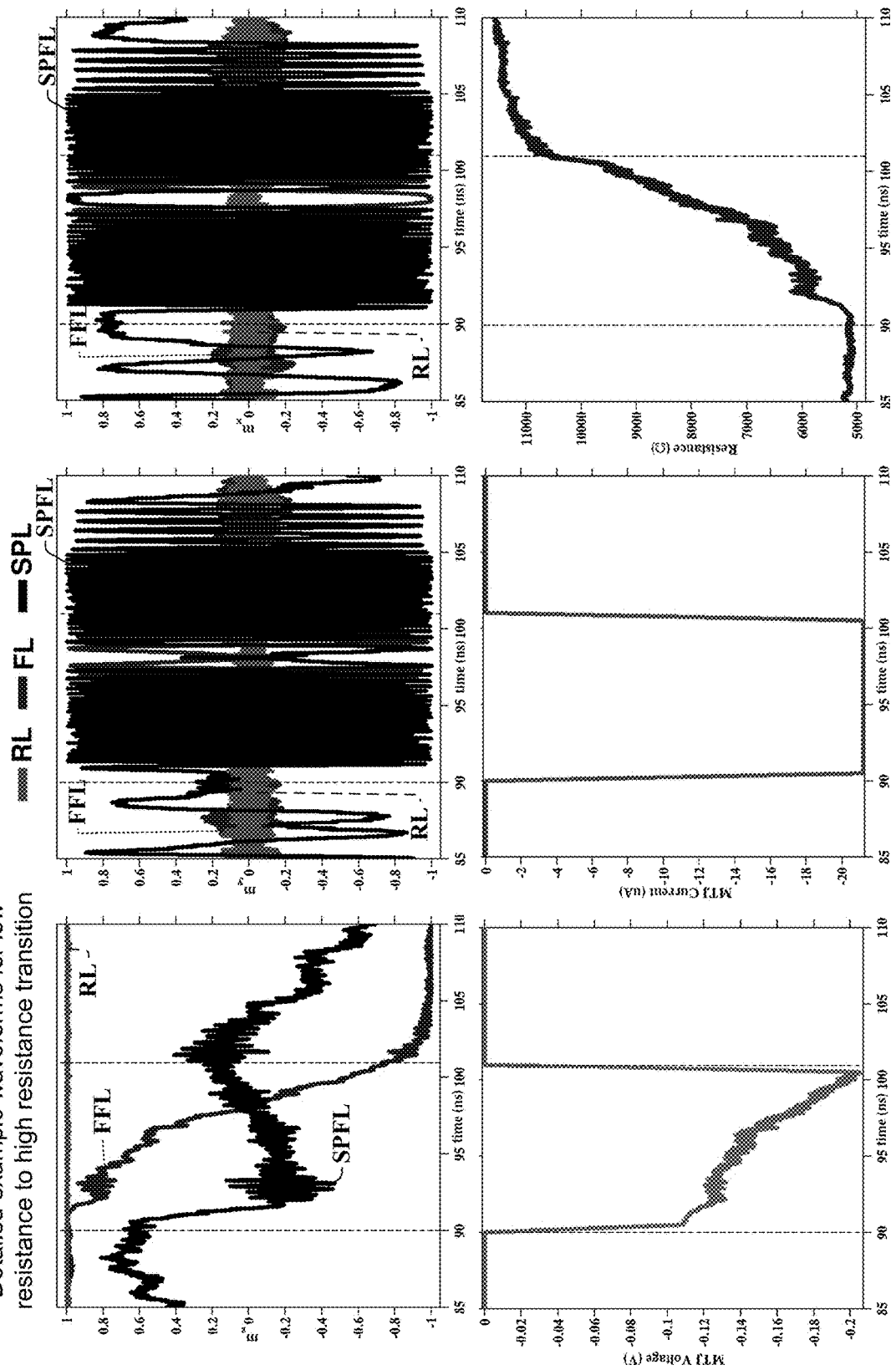
FIG. 5B illustrates an example of more detailed waveforms when a magnetic tunnel junction stack transitions from a low resistance state to a high resistance state.

FIG. 5B depicts an example of more detailed waveforms by which the MTJ switches from a parallel state to an anti-parallel state. The magnetization components of the RL, FFL and SPFL layers along the z, y, and x axes are illustrated in the top waveforms; and the MTJ voltage, MTJ current, and MTJ resistance are shown at corresponding times in the bottom waveforms.

Simulation results comparing STT MRAM write times required to switch data states to those of ferromagnetic memory cells using the compound free layer 100 containing the superparamagnetic free layer 102 confirmed that the latter is significantly faster. For example, in some cases, when a current pulse of 'a' micro amps was applied to a conventional ferromagnetic memory stack without a superparamagnetic free layer, the minimum current pulse width to effectuate switching was estimated by magnetic modelling to be approximately 'b' ns, whereas minimum current pulse width to effectuate switching was estimated to be only '0.044 b' ns with the superparamagnetic free layer in place. Further, when a current pulse of '2 a' micro amps was applied to a conventional ferromagnetic memory stack without a superparamagnetic free layer, the minimum current pulse width to effectuate switching was estimated to be approximately 'c' ns, whereas minimum current pulse width to effectuate switching was estimated to be only '0.33 c' ns with the superparamagnetic free layer in place. Further still, when a current pulse of '3 a' micro amps was applied to a conventional ferromagnetic memory stack without a superparamagnetic free layer, the minimum current pulse width to effectuate switching was estimated to be approximately 'd' ns, whereas minimum current pulse width to effectuate switching was estimated to be only '0.33 d' ns with the superparamagnetic free layer in place. Thus, the superparamagnetic free layer improves current consumption and/or write times compared to conventional STT MRAM. Thus, depending on the speed trade off desired, there can be a secondary benefit over other STT-MRAM approaches due to the substantial reduction in write current especially for ultra-fast write operations, which otherwise need very large current densities. At large switching current density, when the FFL switches the spin-flux acting on RL due to the new direction of the FL, the injected spins and magnetostatic forces may become strong enough to toggle the RL itself, a phenomenon called back-switching or back-hopping. This results in the MTJ getting into a state with both the reference layer and free layer reversed, a state that has same resistance as the original magnetic state prior to write switching pulse application, which is a reliability issue. Hence, for large currents it can often be observed that as current increases first the write error rate (WER) goes down and then later it moves-up. Since, the MTJ with the compound free layer containing the superparamagnetic sublayer embodiments can operate at much lower current densities; the targeted low WER can be achieved prior to reaching the condition when the back-switching phenomenon is starts to be triggered. This allows this MTJ to achieve much better WER, while maintaining a more stable and reliable RL. Furthermore, firstly observe that since a smaller current is now used for switching, the access transistor which drives the MTJ can be made smaller thereby saving the precious silicon area for each cell. Additionally, since the incubation of switching for FFL does not rely on the thermal fluctuation of the FFL, rather it relies on instantaneous non-zero angle between SPFL and FFL, the stochastic variations in write time are also considerably reduced, i.e., the write time distribution becomes narrower. This enables both more reliable switching and less constrained circuit design to drive the switching currents.

The difference in switching mechanism of P-to-AP and AP-to-P provides an additional handle to control the symmetry of the switching currents or voltages. The currents can even be made symmetric or even P-to-AP switching current can be made smaller than AP-to-P switching current. In conventional MTJs, P-to-AP switching takes more current compared to AP-to-P state switching. Often to help in P-to-AP state switching a small stray field is engineered within the MTJ stack by co-optimizing reference layer RL and pinning layer PL, which for our convention of directions in FIG. 4A and FIG. 5A, would be z-axis. This however results in an even stronger—z-axis oriented stray field to act upon the RL which aggravates the problem of back-switching as the RL becomes more unstable. Since in the SPFL MTJ, P-to-AP can even be made more efficient than AP-to-P, to bring AP-to-P on par with P-to-AP switching current a small +z-axis oriented stray field would be used. This would result in even stronger +z-axis oriented field to act upon the RL, which would in fact suppress the back-switching problem of the MTJ. Hence, even larger current densities can be driven reliably through the MTJ to obtain even faster write times.

Figure 6:
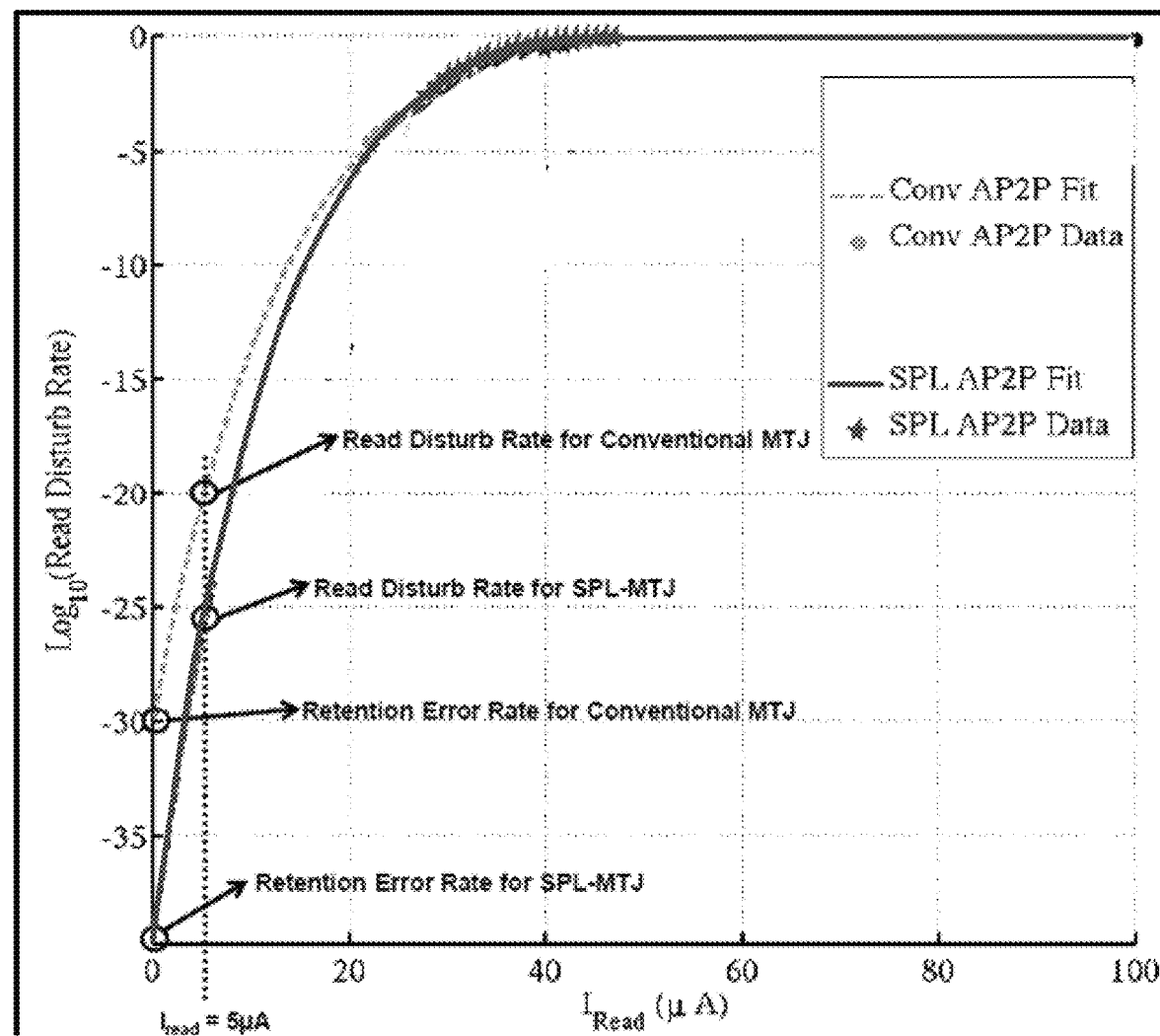
FIG. 6 illustrates a comparison of the read disturb rates achievable with some MTJ embodiments of the compound free layer with a superparamagnetic free layer compared to disturb rates for a conventional ferromagnetic free layer, i.e., one with no superparamagnetic free layer.

Turning now to FIG. 6, we discuss results from room temperature macrospin magnetic simulations that demonstrate improvement of read disturb and retention with the use of the compound free layer structure. The improvement is due to the fact that the perpendicular (z-) component of the moment of the superparamagnetic free layer has reverse z-directions in the two storage states so as to improve the stability of the ferromagnetic free layer in each case. Such a layer switching z-component of magnetization is not a feature shown in the first four devices in FIG. 10.

In FIG. 6, the read operation example is done in the case of applying a "read" current that flows in the same direction as is used for writing a bit into the parallel magnetization state. During the read operation for a bit in the antiparallel state, there is a finite probability of unintentionally writing that bit to the parallel state. The probability of this unintentional outcome is called the read disturb rate (RDR) and RDR values for different read currents are plotted along the vertical axis. Higher bit stability means longer data retention time in the storage state and lower RDR. FIG. 6 shows a comparison of the read disturb rate for a bit with the compound free layer structure compared to a convention MTJ bit. Simulations were done to estimate fail rates down to a RDR of $10^{-3}$ to $10^{-5}$. Below that range, the plot uses fits of those results to analytical formulas for extrapolating estimates of the read disturb rates. As an example, for a read current of 5 µA, as indicated by the vertical dotted line, a conventional MTJ would have a RDR of $10^{-20}$ whereas that of compound free layer with the superparamagnetic free layer has a RDR below $10^{-25}$, 100,000× lower. Alternatively, the superparamagnetic free layer could be utilized to allow a higher write current without increasing the read disturb rate, in this example 8 µA could be utilized maintaining a RDR of $10^{-20}$. Using a higher read current could enable a faster read operation.

On the FIG. 6 plot, a comparison of read disturb rates at zero current corresponds to the ratio of data retention improvement with the compound free layer containing the SPFL sub-layer. The retention rate decrease can be quite substantial. In this estimation, it is by more than a factor of one billion corresponding to an increase of data retention time by the same factor.

Addition of the superparamagnetic free layer in the compound free layer of MTJ stack furthermore can be utilized to achieve a more temperature invariant MTJ cell and especially to reduce retention error rates at high temperatures. In standard MTJs, since magnets become stronger (magnetization and anisotropy increases) at low temperature and weaker (magnetization and anisotropy reduces) at high temperature, it is easier to switch the FFL at high temperatures and more difficult to switch it at low temperatures. Without using bias adjustments, the access transistor driving the MTJ would naturally provide larger current at higher temperature and smaller current at low temperature. Hence, in traditional MTJ cells, when the MTJ is already easier to switch at high temperature the access transistor is also capable of providing larger current which would make switching even easier, whereas when at low temperature when it is more difficult to switch the MTJ, the access transistor provides (without biasing adjustments) smaller current and thus also making switching even more difficult. Now for the compound free layer MTJ the increase in the temperature simultaneously weakens both the FFL and the SPFL, while a decrease in temperature simultaneously (magnetically) strengthens both the SPFL and the FFL. This temperature effect combined with the dipolar interaction between the FFL and the SPFL tends to align the SPFL more towards z-axis as temperature increases, and more towards x-y plane as the temperature reduces. Thus the incubation angle between FFL and SPFL is larger at low temperature, which increases the switching efficiency in the circumstance when it was traditionally harder to switch the FL. On the other hand, since incubation angle between FFL and SPFL is smaller at large temperature the STT efficiency reduces in the circumstance when it is traditionally easier to switch the FL. Therefore, the superparamagnetic layer MTJ (SPFL MTJ) especially for P-state to AP-state exhibits an opposite sign temperature dependence to that of the driving transistor. Therefore, now when it is difficult to switch the MTJ, the access transistor is providing a larger current, whereas when it is easier to switch the MTJ, the access transistor is providing a smaller current. This enables a more thermally invariant MTJ cell and can result in allowing a smaller cell area as the maximum write current over temperature can be reduced. Furthermore, since SPFL aligns more towards z-axis at high temperature, the positive feedback of the dipolar field which stabilizes the FFL becomes stronger. This helps to stem the degradation of the stability of the FFL at high temperatures, which in turn results in much smaller retention error at high temperatures. In addition, it results in a gentler slope for the loss stability of the free layer with increasing temperature, which further enables a design to simultaneously achieve low WER and RDR design targets.

Figure 7:
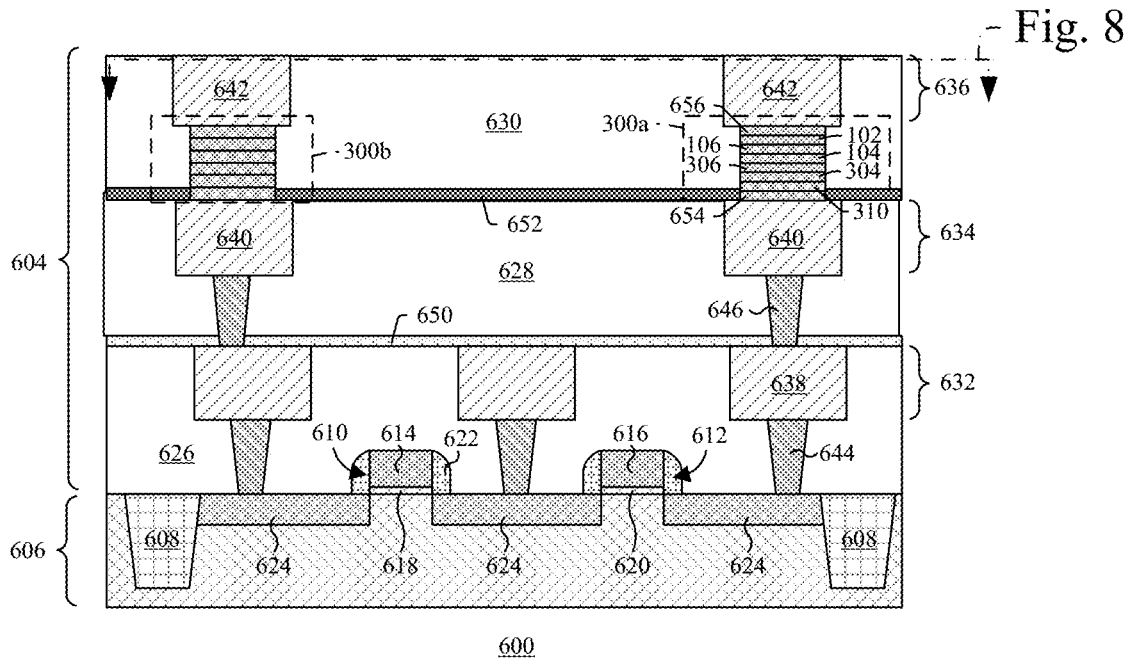
FIG. 7 illustrates a cross-sectional diagram illustrating some embodiments of a magneto resistive random access memory (MRAM) that include an MTJ stack with a superparamagnetic free layer.

FIG. 7 illustrates a cross sectional view of some embodiments of an MRAM integrated circuit 600, which include ferromagnetic memory stacks 300a, 300b disposed in an interconnect structure 604 of the integrated circuit 600. The integrated circuit 600 includes a substrate 606. The substrate 606 may be, for example, a bulk substrate (e.g., a bulk silicon substrate) or a silicon-on-insulator (SOI) substrate. The illustrated embodiment depicts one or more shallow trench isolation (STI) regions 608, which may include a dielectric-filled trench within the substrate 606.

Two word line transistors 610, 612 are disposed between the STI regions 608. The word line transistors 610, 612 include word line gate electrodes 614, 616, respectively; word line gate dielectrics 618, 620, respectively; word line sidewall spacers 622; and source/drain regions 624. The source/drain regions 624 are disposed within the substrate 606 between the word line gate electrodes 614, 616 and the STI regions 608, and are doped to have a first conductivity type which is opposite a second conductivity type of a channel region under the gate dielectrics 618, 620, respectively. The word line gate electrodes 614, 616 may be, for example, doped polysilicon or a metal, such as aluminum, copper, or combinations thereof. The word line gate dielectrics 618, 620 may be, for example, an oxide, such as silicon dioxide, or a high-K dielectric material. The word line sidewall spacers 622 can be made of silicon nitride (e.g., $Si_3N_4$), for example.

The interconnect structure 604 is arranged over the substrate 606 and couples devices (e.g., transistors 610, 612) to one another. The interconnect structure 604 includes a plurality of IMD layers 626, 628, 630, and a plurality of metallization layers 632, 634, 636 which are layered over one another in alternating fashion. The IMD layers 626, 628, 630 may be made, for example, of a low K dielectric, such as un-doped silicate glass, or an oxide, such as silicon dioxide, or an extreme low-K dielectric layer. The metallization layers 632, 634, 636 include metal lines 638, 640, 642, which are formed within trenches, and which may be made of a metal, such as copper or aluminum. Contacts 644 extend from the bottom metallization layer 632 to the source/drain regions 624 and/or gate electrodes 614, 616; and vias 646 extend between the metallization layers 632, 634, 636. The contacts 644 and the vias 646 extend through dielectric-protection layers 650, 652 (which can be made of dielectric material and can act as etch stop layers during manufacturing). The dielectric-protection layers 650, 652 may be made of an extreme low-K dielectric material, such as SiC, for example. The contacts 644 and the vias 646 may be made of a metal, such as copper or tungsten, for example.

MRAM ferromagnetic memory stacks 300a, 300b, which are configured to store respective data states, are arranged within the interconnect structure 604 between neighboring metal layers. The MRAM ferromagnetic memory stack 300a includes a bottom electrode 654 and a top electrode 656, which are made of conductive material. Between its top and bottom electrodes 656, 654, MRAM ferromagnetic memory stack 300a includes an MTJ.

Figure 8:
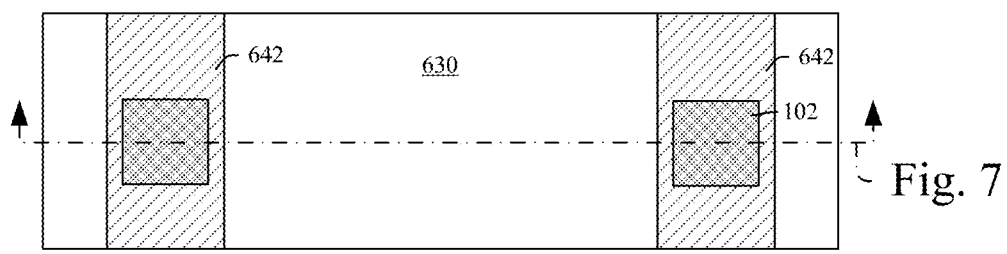
FIG. 8 illustrates a top view of the MRAM of FIG. 7, as indicated by the cut-lines in FIG. 7.

FIG. 8 depicts some embodiments of a top view of FIG. 7's integrated circuit 600 as indicated in the cut-away lines shown in FIGS. 7-8. As can be seen, the ferromagnetic memory stacks 300a, 300b can have a square (or square with rounded corners) or circular shape when viewed from above in some embodiments. In other embodiments, however, for example due to practicalities of many etch processes, the corners of the illustrated square shape can become rounded, resulting in MRAM ferromagnetic memory stacks 300a, 300b having a square shape with rounded corners, or having a circular shape. The MRAM ferromagnetic memory stacks 300a, 300b are arranged over metal lines 640, respectively, and have top electrodes 656 in direct electrical connection with the metal lines 642, respectively, without vias or contacts there between in some embodiments. In other embodiments, vias or contacts couple the top electrodes 656 to the metal lines 642.

Figure 9:
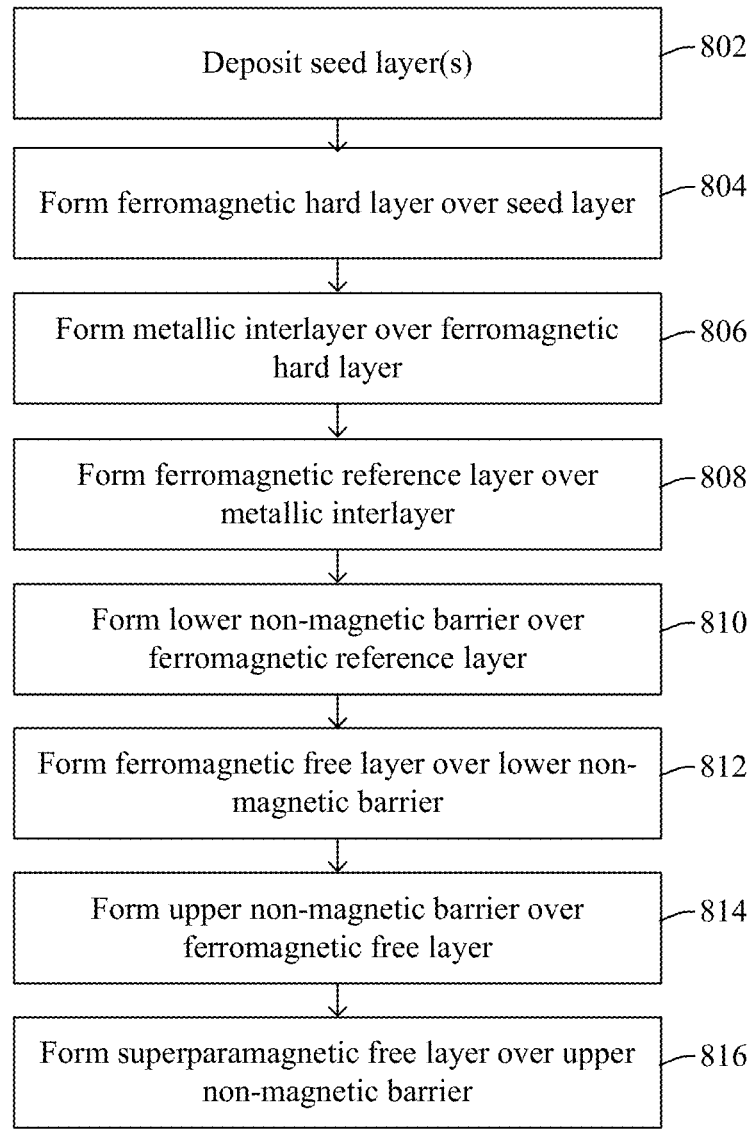
FIG. 9 illustrates a flowchart of some embodiments of the method of manufacturing a magnetic tunnel junction stack containing a superparamagnetic layer coupled to the ferromagnetic free layer.

FIG. 9 illustrates a flowchart of some embodiments of the method of manufacturing a magnetic tunnel junction stack.

At 802 a seed layer is formed on a wafer. In some embodiments, this act can, for example, correspond to forming a seed layer 308 as illustrated in FIG. 3A. In some embodiments, the seed layer maybe a multilayer stack.

At 804, a ferromagnetic hard layer is formed over the seed layer. In some embodiments, this act can, for example, correspond to forming a ferromagnetic hard layer 310 as illustrated in FIG. 3A. In some embodiments, the ferromagnetic hard layer may be a multilayer stack.

At 806, a metallic interlayer (typically an exchange coupling interlayer comprised of Ru or Ir of thickness so as to provide antiparallel (antiferromagnetic) exchange coupling (e.g., about 3 to 5 Angstroms or 8 to 10 Angstroms) is formed over the hard ferromagnetic hard layer 310. In some embodiments, this act can, for example, correspond to forming a metallic antiparallel exchange coupling interlayer 312 as illustrated in FIG. 3A.

At 808, a ferromagnetic reference layer, which can even be a composite layer or a multi-layered set of ferromagnetic reference layer, spacer and another hard ferromagnetic layer, is formed over the metallic interlayer. In some embodiments, this act can, for example, correspond to forming a ferromagnetic reference layer 304 as illustrated in FIG. 3A.

At 810, a lower non-magnetic barrier is formed over the ferromagnetic reference layer. In some embodiments, this act can, for example, correspond to forming a bottom non-magnetic barrier 306 as illustrated in FIG. 3A.

At 812, a ferromagnetic free layer 104 is formed over the lower non-magnetic barrier. In some embodiments, this act can, for example, correspond to forming a ferromagnetic free layer 104 as illustrated in FIG. 3A.

At 814, an upper non-magnetic barrier layer is formed over ferromagnetic free layer. In some embodiments, this act can, for example, correspond to forming an upper non-magnetic barrier layer 106 as illustrated in FIG. 3A.

At 816, a superparamagnetic free layer is formed over the upper non-magnetic barrier layer. In some embodiments, this act can, for example, correspond to forming a superparamagnetic free layer 102 as illustrated in FIG. 3A.

While the flowchart 800 of FIG. 9 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Note that although this disclosure is described largely in the context of memory, the disclosure can also be applied to spin-logic, spin-based random number generators, and spin-based neuromorphic computing as a computing element. In all these applications we rely on raw performance of the MTJ, and improvements of any such MTJ as described in this disclosure are also applicable to these technologies.

Thus, in some embodiments, the present application provides a memory device. The memory device includes compound free layer structure comprised of a ferromagnetic free layer; a non-magnetic barrier layer overlying the ferromagnetic free layer; and a superparamagnetic free layer overlying the non-magnetic barrier layer.

In other embodiments, the present application provides a memory device but in a different way. The memory device includes a hard ferromagnetic layer having a fixed magnetization. A ferromagnetic reference layer is disposed over the hard ferromagnetic layer. The ferromagnetic reference layer has a fixed magnetization which is opposite to the hard ferromagnetic layer's magnetization. A lower non-magnetic barrier layer is disposed over the ferromagnetic reference layer. A ferromagnetic free layer is disposed over the lower non-magnetic barrier layer. An upper non-magnetic barrier layer is disposed over the ferromagnetic free layer. A superparamagnetic free layer overlies the upper non-magnetic barrier layer.

In yet other embodiments, the present disclosure provides an integrated circuit including a semiconductor substrate. An interconnect structure is disposed over the semiconductor substrate, and includes a plurality of dielectric layers and a plurality of metal layers stacked over one another. The plurality of metal layers includes a lower metal layer and an upper metal layer disposed over the lower metal layer. A magneto-resistive random access memory (MRAM) ferromagnetic memory stack is arranged over the upper metal layer. The MRAM cell includes a bottom electrode disposed over and in electrical contact with the lower metal layer. A magnetic tunnel junction (MTJ) is disposed over an upper surface of the bottom electrode. The MTJ includes a compound free layer structure which in turns includes a superparamagnetic free layer magnetically coupled to the free layer. A top electrode is disposed over an upper surface of the MTJ.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A compound free layer for a memory device, comprising:
    a ferromagnetic free layer;
    a non-magnetic barrier layer overlying the ferromagnetic free layer, the non-magnetic barrier layer meeting the ferromagnetic free layer at an interface extending in parallel with an in-plane direction; and
    a first superparamagnetic free layer overlying the non-magnetic barrier layer, the first superparamagnetic free layer having a magnetization component that is superparamagnetic in the in-plane direction, wherein the first superparamagnetic free layer comprises a plurality of superparamagnetic nano-particles.

2. The compound free layer of claim 1, wherein the ferromagnetic free layer has a magnetization axis perpendicular to the interface, and the first superparamagnetic free layer has a magnetization that in time precesses randomly at angles offset from the magnetization axis by a time-variant amount that remains greater than zero degrees and less than ninety degrees during precession, wherein the time-variant amount retains a magnetization direction component that remains continuously in parallel with the magnetization axis while in a storage state.

3. The compound free layer of claim 2, wherein a magnetization direction of the first superparamagnetic free layer varies during precession to exhibit a randomly varying nutation while retaining the magnetization component in parallel with the magnetization axis of the ferromagnetic free layer when in the storage state.

4. The compound free layer of claim 1, wherein the first superparamagnetic free layer directly contacts the non-magnetic barrier layer, and the non-magnetic barrier layer directly contacts the ferromagnetic free layer.

5. The compound free layer of claim 1, wherein a common central axis passes linearly through respective central portions of the ferromagnetic free layer, the non-magnetic barrier layer, and the first superparamagnetic free layer, respectively.

6. The compound free layer of claim 5, wherein each of the ferromagnetic free layer, the non-magnetic barrier layer, and the first superparamagnetic free layer are substantially square shaped with or without rounded corners around the common central axis.

7. The compound free layer of claim 1, further comprising:
    a second superparamagnetic free layer overlying the first superparamagnetic free layer; and
    an interlayer exchange coupling layer overlying the first superparamagnetic free layer and separating the first superparamagnetic free layer from the second superparamagnetic free layer.

8. A memory device, comprising:
    a ferromagnetic hard layer having a fixed magnetization vector;
    a composite ferromagnetic reference layer disposed over the ferromagnetic hard layer, the composite ferromagnetic reference layer having a fixed magnetization which is opposite to the fixed magnetization vector of the ferromagnetic hard layer;
    a lower non-magnetic barrier layer disposed over the composite ferromagnetic reference layer;
    a ferromagnetic free layer disposed over the lower non-magnetic barrier layer;
    an upper non-magnetic barrier layer disposed over the ferromagnetic free layer; and a superparamagnetic free layer overlying the upper non-magnetic barrier layer, the superparamagnetic free layer having an in-plane component that is superparamagnetic.

9. The memory device of claim 8, wherein the superparamagnetic free layer is a continuous crystalline layer having a thickness as measured perpendicularly between the upper non-magnetic barrier layer and an upper surface of the superparamagnetic free layer, wherein the superparamagnetic free layer has a length, width, and/or radius that are substantially equal and that range from 5 nm to 500 nm, and has a thickness from 0.5 nm to 20 nm.

10. The memory device of claim 8, further comprising:
a second superparamagnetic free layer overlying the superparamagnetic free layer; and
a metallic interlayer exchange coupling layer overlying the superparamagnetic free layer and separating the superparamagnetic free layer from the second superparamagnetic free layer.

11. The memory device of claim 10, wherein the metallic interlayer exchange coupling layer comprises Ru or Ir.

12. The memory device of claim 8, wherein a common central axis passes linearly through respective central portions of the ferromagnetic hard layer, the composite ferromagnetic reference layer, the ferromagnetic free layer, the upper non-magnetic barrier layer, and the superparamagnetic free layer, respectively.

13. The memory device of claim 12, wherein each of the ferromagnetic hard layer, the composite ferromagnetic reference layer, the ferromagnetic free layer, the upper non-magnetic barrier layer, and the superparamagnetic free layer are cylindrically shaped and have substantially equal radii.

14. The memory device of claim 8, wherein the lower non-magnetic barrier layer and the upper non-magnetic barrier layer are each comprised of magnesium oxide, spinel, aluminum oxide, or titanium oxide.

15. The memory device of claim 8, wherein the upper non-magnetic barrier layer is comprised of copper, silver, gold, Ta, W, Mo, chromium, manganese, a transition metal dichalcogenide (TMD), or graphene.

16. The memory device of claim 8, wherein the ferromagnetic free layer has a magnetization axis, and the superparamagnetic free layer has a magnetization that randomly precesses around the magnetization axis by a time-variant angle that is offset from the magnetization axis by a time-variant amount that remains greater than zero degrees and less than ninety degrees during precession, wherein the time-variant amount varies but retains a magnetization direction component that remains in parallel with the magnetization axis while in a storage state.

17. The memory device of claim 16, wherein motion at the time-variant amount varies during precession to exhibit a random nutation while retaining a magnetization direction component in parallel with the magnetization axis due to magnetic interaction with the ferromagnetic free layer while in the storage state.

18. The memory device of claim 8, wherein the superparamagnetic free layer and the ferromagnetic free layer each is comprised of cobalt and/or iron and/or boron, and the upper non-magnetic barrier layer is comprised of magnesium oxide, aluminum oxide, titanium oxide copper, silver, gold, Ta, W, Mo, chromium, manganese, a transition metal dichalcogenide, or graphene.

19. An integrated circuit, comprising:
a semiconductor substrate;
an interconnect structure disposed over the semiconductor substrate, and including a plurality of dielectric layers and a plurality of metal layers stacked over one another, wherein the plurality of metal layers include a lower metal layer and an upper metal layer disposed over the lower metal layer; and
a magnetoresistive random access memory (MRAM) magnetic stack structure arranged over the upper metal layer, the MRAM magnetic stack structure comprising:
a bottom electrode disposed over and in electrical contact with the lower metal layer;
a magnetic tunnel junction (MTJ) disposed over an upper surface of the bottom electrode, the MTJ comprising a superparamagnetic free layer; and
a top electrode disposed over an upper surface of the MTJ; and
an etch stop layer disposed directly over a topmost surface of a dielectric layer of the plurality of dielectric layers, contacting outer sidewalls of the bottom electrode and directly overlying a top surface of the upper metal layer.

20. The integrated circuit of claim 19, wherein the MTJ comprises:
a ferromagnetic hard layer over the bottom electrode, the ferromagnetic hard layer having a hard magnetization;
a ferromagnetic reference layer disposed over the ferromagnetic hard layer, the ferromagnetic reference layer having a fixed magnetization which is opposite to the hard magnetization;
a lower non-magnetic barrier layer disposed over the ferromagnetic reference layer;
a ferromagnetic free layer disposed over the lower non-magnetic barrier layer; and
an upper non-magnetic barrier layer disposed over the ferromagnetic free layer; and
wherein the superparamagnetic free layer separates the upper non-magnetic barrier layer from the top electrode.

* * * * *